(12) United States Patent
Sharenko et al.

(10) Patent No.: US 11,217,715 B2
(45) Date of Patent: Jan. 4, 2022

(54) PHOTOVOLTAIC MODULE FRONTSHEET AND BACKSHEET

(71) Applicant: GAF Energy LLC, Parsippany, NJ (US)

(72) Inventors: Alexander Sharenko, Berkeley, CA (US); Paul Martin Adriani, Palo Alto, CA (US); Ryan Lemon Devine, Richmond, CA (US)

(73) Assignee: GAF Energy LLC, Parsippany, NJ (US)

( * ) Notice: Subject to any disclaimer, the term of this patent is extended or adjusted under 35 U.S.C. 154(b) by 0 days.

(21) Appl. No.: 17/166,640

(22) Filed: Feb. 3, 2021

(65) Prior Publication Data

US 2021/0343886 A1 Nov. 4, 2021

Related U.S. Application Data

(60) Provisional application No. 63/111,196, filed on Nov. 9, 2020, provisional application No. 63/018,013, filed (Continued)

(51) Int. Cl.
| | |
|---|---|
| *H01L 31/048* | (2014.01) |
| *B32B 17/10* | (2006.01) |
| *B32B 37/12* | (2006.01) |
| *B32B 27/18* | (2006.01) |
| *B32B 27/30* | (2006.01) |
| *B32B 27/36* | (2006.01) |
| *B32B 27/28* | (2006.01) |

(Continued)

(52) U.S. Cl.
CPC ............ *H01L 31/0481* (2013.01); *B32B 5/02* (2013.01); *B32B 7/12* (2013.01); *B32B 17/10* (2013.01); *B32B 25/16* (2013.01); *B32B 27/12* (2013.01); *B32B 27/18* (2013.01); *B32B 27/283* (2013.01); *B32B 27/304* (2013.01); *B32B 27/308* (2013.01); *B32B 27/32* (2013.01); *B32B 27/36* (2013.01); *B32B 37/1207* (2013.01); *H01L 31/0488* (2013.01); *B32B 2305/72* (2013.01); *B32B 2307/3065* (2013.01); *B32B 2307/7265* (2013.01); *B32B 2327/18* (2013.01); *B32B 2457/12* (2013.01); *H01L 31/049* (2014.12)

(58) Field of Classification Search
None
See application file for complete search history.

(56) References Cited

U.S. PATENT DOCUMENTS

| | | |
|---|---|---|
| 6,008,450 A | 12/1999 | Ohtsuka et al. |
| 7,587,864 B2 | 9/2009 | McCaskill et al. |
| (Continued) | | |

FOREIGN PATENT DOCUMENTS

| | | |
|---|---|---|
| CA | 2829440 A1 | 4/2014 |
| JP | 2001-098703 A | 4/2001 |
| WO | 2011/049944 A1 | 4/2011 |

*Primary Examiner* — Ramsey Zacharia
(74) *Attorney, Agent, or Firm* — Greenberg Traurig, LLP

(57) ABSTRACT

A photovoltaic module includes at least one solar cell, an encapsulant encapsulating the at least one solar cell, a frontsheet juxtaposed with the encapsulant, and backsheet juxtaposed with the encapsulant. The frontsheet includes a glass layer, a polymer layer attached to the glass layer, and an adhesive layer attaching the polymer layer to the glass layer. The backsheet includes a single-layer, moisture-resistant, fire-retardant membrane.

10 Claims, 3 Drawing Sheets

Related U.S. Application Data on Apr. 30, 2020, provisional application No. 63/018,003, filed on Apr. 30, 2020.

(51) Int. Cl.

| | | |
|---|---|---|
| *B32B 27/32* | (2006.01) | |
| *B32B 27/12* | (2006.01) | |
| *B32B 25/16* | (2006.01) | |
| *B32B 5/02* | (2006.01) | |
| *B32B 7/12* | (2006.01) | |
| *H01L 31/049* | (2014.01) | |

(56) References Cited

U.S. PATENT DOCUMENTS

| | | | |
|---|---|---|---|
| 7,678,990 B2 | 3/2010 | McCaskill et al. | |
| 7,678,991 B2 | 3/2010 | McCaskill et al. | |
| 7,819,114 B2 | 10/2010 | Augenbraun et al. | |
| 7,824,191 B1 | 11/2010 | Browder | |
| 7,832,176 B2 | 11/2010 | McCaskill et al. | |
| 8,215,070 B2 | 7/2012 | Railkar et al. | |
| 8,371,076 B2 | 2/2013 | Jones et al. | |
| 8,468,754 B2 | 6/2013 | Railkar et al. | |
| 8,505,249 B2 | 8/2013 | Geary | |
| 8,512,866 B2 | 8/2013 | Taylor | |
| 8,623,499 B2 | 1/2014 | Viasnoff | |
| 8,713,860 B2 | 5/2014 | Railkar et al. | |
| 8,925,262 B2 | 1/2015 | Railkar et al. | |
| 8,946,544 B2 | 2/2015 | Jacobs et al. | |
| 8,994,224 B2 | 3/2015 | Mehta et al. | |
| 9,145,498 B2 | 9/2015 | Ultsch | |
| 9,169,646 B2 | 10/2015 | Rodrigues et al. | |
| 9,273,885 B2 | 3/2016 | Rodrigues et al. | |
| 9,359,014 B1 | 6/2016 | Yang et al. | |
| 9,670,353 B2 | 6/2017 | Peng et al. | |
| 9,711,672 B2 | 7/2017 | Wang | |
| 9,912,284 B2 | 3/2018 | Svec | |
| 9,923,515 B2 | 3/2018 | Rodrigues et al. | |
| 9,987,786 B2 | 6/2018 | Stoiljkovic et al. | |
| 9,991,412 B2 | 6/2018 | Gonzalez et al. | |
| 10,015,933 B2 | 7/2018 | Boldrin | |
| 10,027,273 B2 | 7/2018 | West et al. | |
| 10,155,850 B2 | 12/2018 | Leng et al. | |
| 10,179,852 B2 | 1/2019 | Gossi et al. | |
| 10,187,005 B2 | 1/2019 | Rodrigues et al. | |
| 10,256,765 B2 | 4/2019 | Rodrigues et al. | |
| 10,480,192 B2 | 11/2019 | Xing et al. | |
| 7,666,491 B2 | 2/2020 | Yang et al. | |
| 10,669,414 B2 | 6/2020 | Li et al. | |
| 10,907,355 B2 | 2/2021 | Hubbard et al. | |
| 10,914,063 B2 | 2/2021 | Lee et al. | |
| RE48,555 E | 5/2021 | Cancio et al. | |
| 11,015,085 B2 | 5/2021 | Bruns et al. | |
| 11,065,849 B2 | 7/2021 | Ackermann et al. | |
| 2002/0102422 A1 | 8/2002 | Hubbard et al. | |
| 2003/0217768 A1 | 11/2003 | Guha | |
| 2006/0042683 A1 | 3/2006 | Gangemi | |
| 2009/0114261 A1 | 5/2009 | Stancel et al. | |
| 2009/0159118 A1 | 6/2009 | Kalkanoglu | |
| 2010/0101634 A1 | 4/2010 | Frank et al. | |
| 2010/0326501 A1* | 12/2010 | Zhao | B32B 15/20 136/252 |
| 2011/0011457 A1 | 1/2011 | Sportel et al. | |
| 2011/0030761 A1 | 2/2011 | Kalkanoglu et al. | |
| 2011/0036386 A1 | 2/2011 | Browder | |
| 2011/0048507 A1 | 3/2011 | Livsey et al. | |
| 2011/0058337 A1 | 3/2011 | Han | |
| 2011/0104488 A1* | 5/2011 | Mussig | C09J 123/02 428/355 EN |
| 2011/0132427 A1 | 6/2011 | Kalkanoglu et al. | |
| 2011/0239555 A1 | 10/2011 | Cook et al. | |
| 2011/0302859 A1 | 12/2011 | Crasnianski | |
| 2012/0060902 A1 | 3/2012 | Drake | |
| 2012/0176077 A1 | 7/2012 | Oh et al. | |
| 2012/0212065 A1 | 8/2012 | Cheng et al. | |
| 2012/0240490 A1 | 9/2012 | Gangemi | |
| 2012/0266942 A1 | 10/2012 | Komatsu et al. | |
| 2012/0312366 A1 | 12/2012 | Starry et al. | |
| 2013/0014455 A1 | 1/2013 | Grieco | |
| 2015/0024159 A1 | 1/2015 | Bess et al. | |
| 2015/0340516 A1* | 11/2015 | Kim | H01L 31/02164 438/70 |
| 2016/0359451 A1 | 12/2016 | Mao et al. | |
| 2017/0159292 A1 | 6/2017 | Chihlas et al. | |
| 2017/0203555 A1 | 7/2017 | Wang et al. | |
| 2018/0094438 A1 | 4/2018 | Wu et al. | |
| 2018/0094439 A1 | 4/2018 | Wang et al. | |
| 2018/0277691 A1 | 9/2018 | Karkkainen et al. | |
| 2018/0281347 A1 | 10/2018 | Gossi | |
| 2018/0351502 A1 | 12/2018 | Almy et al. | |
| 2020/0020819 A1 | 1/2020 | Farhangi | |
| 2020/0144958 A1 | 5/2020 | Rodrigues et al. | |
| 2020/0224419 A1 | 7/2020 | Boss et al. | |
| 2021/0002898 A1 | 1/2021 | Knebel et al. | |
| 2021/0095474 A1 | 4/2021 | Yang et al. | |
| 2021/0113970 A1 | 4/2021 | Stainer et al. | |
| 2021/0115223 A1 | 4/2021 | Bonekamp et al. | |
| 2021/0171808 A1 | 6/2021 | Ackermann et al. | |
| 2021/0172174 A1 | 6/2021 | Ackermann et al. | |

\* cited by examiner

PHOTOVOLTAIC MODULE FRONTSHEET AND BACKSHEET

CROSS-REFERENCE TO RELATED APPLICATIONS

This application is a Section 111(a) application relating to and claiming the benefit of commonly-owned, U.S. Provisional Patent Application Ser. No. 63/018,003, filed Apr. 30, 2020, entitled "PHOTOVOLTAIC MODULE FRONTSHEET," commonly-owned, U.S. Provisional Patent Application Ser. No. 63/111,196, filed Nov. 9, 2020, entitled "PHOTOVOLTAIC MODULE FRONTSHEET," and commonly-owned, U.S. Provisional Patent Application Ser. No. 63/018,013, filed Apr. 30, 2020, entitled "PHOTOVOLTAIC MODULE BACKSHEET the contents of each of which is incorporated herein by reference in its entirety.

FIELD OF THE INVENTION

The present invention relates to photovoltaic modules and, more particularly, frontsheets and backsheets for photovoltaic modules.

BACKGROUND OF THE INVENTION

Photovoltaic systems having solar panels are commonly installed on roofing of structures. What is needed is a photovoltaic module frontsheet and backsheet that enhance the features and performance of the photovoltaic modules.

SUMMARY OF THE INVENTION

In an embodiment, a photovoltaic module includes at least one solar cell; an encapsulant encapsulating the at least one solar cell; and a frontsheet juxtaposed with the encapsulant, wherein the frontsheet includes a glass layer, and a polymer layer attached to the glass layer. In an embodiment, the polymer layer is attached to the glass layer by an adhesive layer. In an embodiment, the adhesive layer is selected from the group consisting of polyvinyl butyrate, acrylic, silicone, and polycarbonate adhesives. In an embodiment, the adhesive layer is selected from the group consisting of thermosetting polyolefin, thermosetting polyolefin encapsulant material, thermosetting ethylene-vinyl acetate (EVA), EVA encapsulants, thermoplastic olefin, thermoplastic polyolefin (TPO) and hybrids and combinations thereof. In an embodiment, the adhesive layer includes a thermosetting polyolefin encapsulant material.

In an embodiment, the adhesive layer includes a thickness of 1 µm to 900 µm. In an embodiment, the polymer layer is thermally bonded to the glass layer. In an embodiment, the polymer layer includes a fluoropolymer. In an embodiment, the fluoropolymer is selected from the group consisting of ethylene tetrafluoroethylene (ETFE), polyvinylidene fluoride (PVDF), tetrafluoroethylene-hexafluoropropylene copolymers (FEP), tetrafluoroethylene-hexafluoropropylene-vinylidene fluoride copolymers (THV), polyvinyl fluoride (PVF), and blends thereof. In an embodiment, the polymer layer includes a material selected from the group consisting of acrylics, polyesters, silicones, and polycarbonates. In an embodiment, the polymer layer includes a crosslinked polymeric material.

In an embodiment, the glass layer includes a thickness of 2.5 mm to 4 mm. In an embodiment, the polymer layer includes a thickness of 0.025 mm to 0.1 mm. In an embodiment, the photovoltaic module further includes a backsheet juxtaposed with the encapsulant. In an embodiment, the backsheet includes thermoplastic polyolefin (TPO). In an embodiment, the photovoltaic module is configured to be installed on a roof deck.

In an embodiment, a photovoltaic module includes at least one solar cell; an encapsulant encapsulating the at least one solar cell; and a backsheet juxtaposed with the encapsulant, and wherein the backsheet includes a moisture-resistant, fire-retardant membrane. In an embodiment, the membrane includes thermoplastic polyolefin (TPO). In an embodiment, the membrane includes polyvinyl chloride. In an embodiment, the membrane includes ethylene propylene diene monomer (EPDM) rubber. In an embodiment, the membrane includes a flame retardant additive selected from the group consisting of clays, nanoclays, silicas, carbon black, metal hydroxide, metal foils, graphite, and combinations thereof. In an embodiment, the backsheet includes a water vapor transmission rate in a range of 0.01 U.S. perm to 0.05 U.S. perm.

In an embodiment, the moisture-resistant, fire-retardant membrane is the sole fire-retardant layer in the photovoltaic module. In an embodiment, the membrane includes a first ply and a second ply. In an embodiment, the membrane includes a scrim intermediate the first ply and the second ply. In an embodiment, the scrim is made from a material selected from the group consisting of polyesters, polyethylene, carbon fiber, fiberglass, aramids, and combinations thereof. In an embodiment, the photovoltaic module is configured to be installed on a roof deck.

In an embodiment, a photovoltaic module includes at least one solar cell; an encapsulant; and a backsheet, wherein the backsheet includes a moisture-resistant, fire-retardant membrane, wherein the encapsulant and the backsheet form a single, hybrid layer, and wherein the hybrid layer encapsulates the at least one solar cell. In an embodiment, the hybrid layer encapsulates 50% to 100% of an exterior surface area of the at least one solar cell.

DETAILED DESCRIPTION

Figure 1:
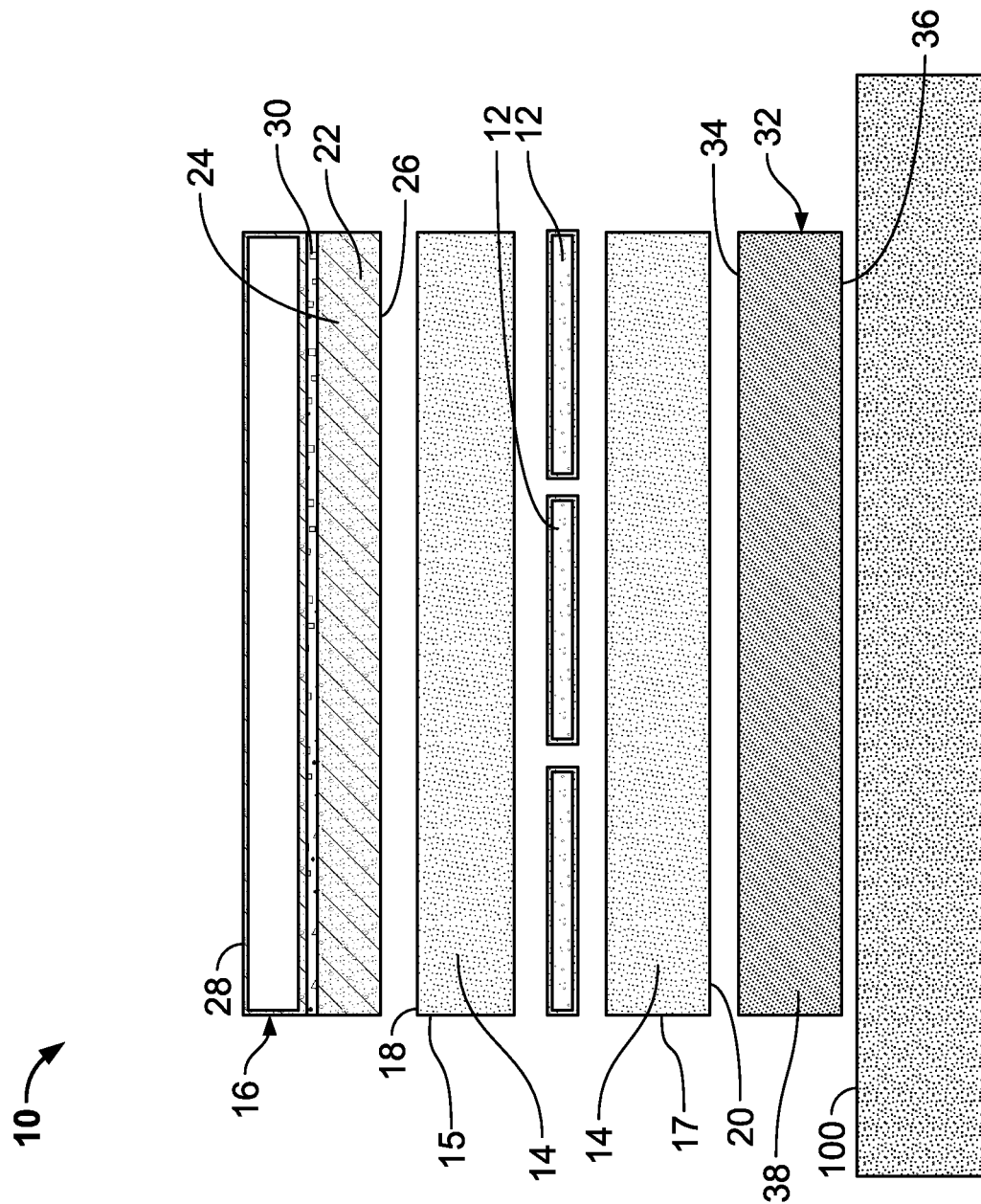
FIG. 1 is a schematic view of an embodiment of a photovoltaic module.
Figure 2:
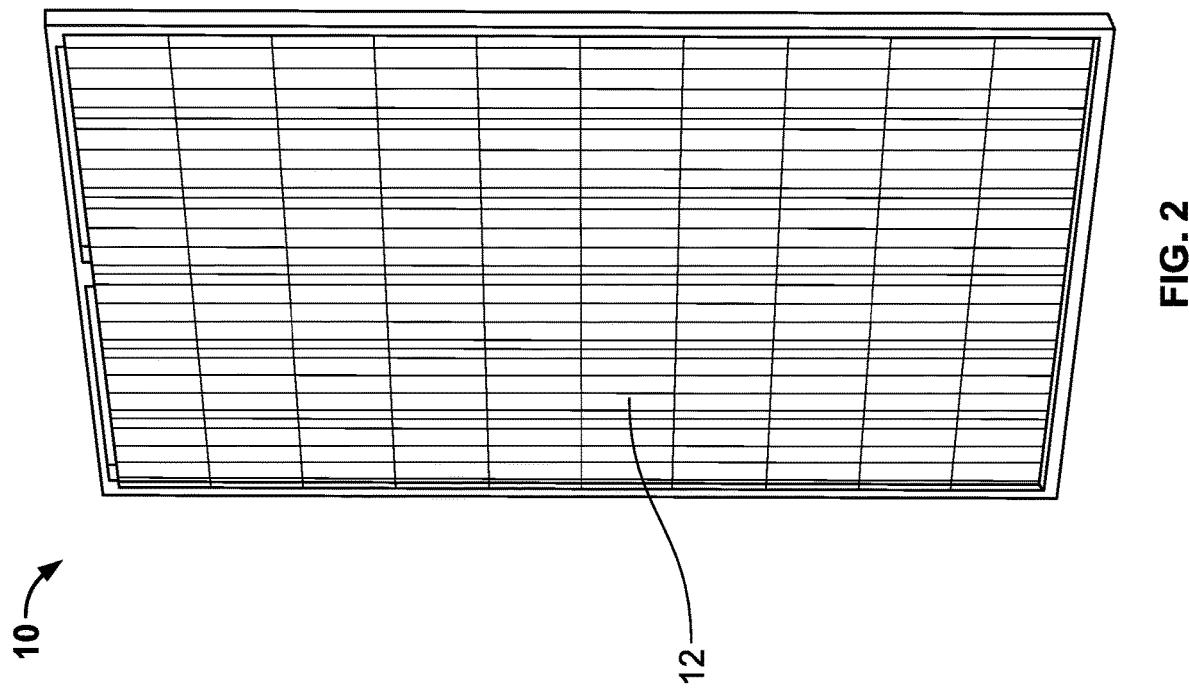
FIG. 2 is an embodiment of a photovoltaic module.

Referring to FIGS. 1 and 2, in an embodiment, a photovoltaic module 10 includes at least one solar cell 12, an encapsulant 14 encapsulating the at least one solar cell 12, and a frontsheet 16 juxtaposed with the encapsulant 14. As used herein, the terms "encapsulating" and "encapsulates" mean to partially or fully envelope or enclose, and with respect to certain embodiments of the photovoltaic module 10, the at least one solar cell 12 is fully enveloped by or enclosed within the encapsulant 14, or partially enveloped by or enclosed within the encapsulant 14.

In an embodiment, the encapsulant 14 encapsulates 50% to 99.9% of an exterior surface area of the at least one solar cell 12. In another embodiment, the encapsulant 14 encapsulates 55% to 99.9% of an exterior surface area of the at least one solar cell 12. In another embodiment, the encapsulant 14 encapsulates 60% to 99.9% of an exterior surface area of the at least one solar cell 12. In another embodiment, the encapsulant 14 encapsulates 65% to 99.9% of an exterior surface area of the at least one solar cell 12. In another embodiment, the encapsulant 14 encapsulates 70% to 99.9% of an exterior surface area of the at least one solar cell 12. In another embodiment, the encapsulant 14 encapsulates 75% to 99.9% of an exterior surface area of the at least one solar cell 12. In another embodiment, the encapsulant 14 encapsulates 80% to 99.9% of an exterior surface area of the at least one solar cell 12. In another embodiment, the encapsulant 14 encapsulates 85% to 99.9% of an exterior surface area of the at least one solar cell 12. In another embodiment, the encapsulant 14 encapsulates 90% to 99.9% of an exterior surface area of the at least one solar cell 12. In another embodiment, the encapsulant 14 encapsulates 95% to 99.9% of an exterior surface area of the at least one solar cell 12.

In another embodiment, the encapsulant 14 encapsulates 50% to 95% of an exterior surface area of the at least one solar cell 12. In another embodiment, the encapsulant 14 encapsulates 55% to 95% of an exterior surface area of the at least one solar cell 12. In another embodiment, the encapsulant 14 encapsulates 60% to 95% of an exterior surface area of the at least one solar cell 12. In another embodiment, the encapsulant 14 encapsulates 65% to 95% of an exterior surface area of the at least one solar cell 12. In another embodiment, the encapsulant 14 encapsulates 70% to 95% of an exterior surface area of the at least one solar cell 12. In another embodiment, the encapsulant 14 encapsulates 75% to 95% of an exterior surface area of the at least one solar cell 12. In another embodiment, the encapsulant 14 encapsulates 80% to 95% of an exterior surface area of the at least one solar cell 12. In another embodiment, the encapsulant 14 encapsulates 85% to 95% of an exterior surface area of the at least one solar cell 12. In another embodiment, the encapsulant 14 encapsulates 90% to 95% of an exterior surface area of the at least one solar cell 12.

In another embodiment, the encapsulant 14 encapsulates 50% to 90% of an exterior surface area of the at least one solar cell 12. In another embodiment, the encapsulant 14 encapsulates 55% to 90% of an exterior surface area of the at least one solar cell 12. In another embodiment, the encapsulant 14 encapsulates 60% to 90% of an exterior surface area of the at least one solar cell 12. In another embodiment, the encapsulant 14 encapsulates 65% to 90% of an exterior surface area of the at least one solar cell 12. In another embodiment, the encapsulant 14 encapsulates 70% to 90% of an exterior surface area of the at least one solar cell 12. In another embodiment, the encapsulant 14 encapsulates 75% to 90% of an exterior surface area of the at least one solar cell 12. In another embodiment, the encapsulant 14 encapsulates 80% to 90% of an exterior surface area of the at least one solar cell 12. In another embodiment, the encapsulant 14 encapsulates 85% to 90% of an exterior surface area of the at least one solar cell 12.

In another embodiment, the encapsulant 14 encapsulates 50% to 85% of an exterior surface area of the at least one solar cell 12. In another embodiment, the encapsulant 14 encapsulates 55% to 85% of an exterior surface area of the at least one solar cell 12. In another embodiment, the encapsulant 14 encapsulates 60% to 85% of an exterior surface area of the at least one solar cell 12. In another embodiment, the encapsulant 14 encapsulates 65% to 85% of an exterior surface area of the at least one solar cell 12. In another embodiment, the encapsulant 14 encapsulates 70% to 85% of an exterior surface area of the at least one solar cell 12. In another embodiment, the encapsulant 14 encapsulates 75% to 85% of an exterior surface area of the at least one solar cell 12. In another embodiment, the encapsulant 14 encapsulates 80% to 85% of an exterior surface area of the at least one solar cell 12.

In another embodiment, the encapsulant 14 encapsulates 50% to 80% of an exterior surface area of the at least one solar cell 12. In another embodiment, the encapsulant 14 encapsulates 55% to 80% of an exterior surface area of the at least one solar cell 12. In another embodiment, the encapsulant 14 encapsulates 60% to 80% of an exterior surface area of the at least one solar cell 12. In another embodiment, the encapsulant 14 encapsulates 65% to 80% of an exterior surface area of the at least one solar cell 12. In another embodiment, the encapsulant 14 encapsulates 70% to 80% of an exterior surface area of the at least one solar cell 12. In another embodiment, the encapsulant 14 encapsulates 75% to 80% of an exterior surface area of the at least one solar cell 12.

In another embodiment, the encapsulant 14 encapsulates 50% to 75% of an exterior surface area of the at least one solar cell 12. In another embodiment, the encapsulant 14 encapsulates 55% to 75% of an exterior surface area of the at least one solar cell 12. In another embodiment, the encapsulant 14 encapsulates 60% to 75% of an exterior surface area of the at least one solar cell 12. In another embodiment, the encapsulant 14 encapsulates 65% to 75% of an exterior surface area of the at least one solar cell 12. In another embodiment, the encapsulant 14 encapsulates 70% to 75% of an exterior surface area of the at least one solar cell 12.

In another embodiment, the encapsulant 14 encapsulates 50% to 70% of an exterior surface area of the at least one solar cell 12. In another embodiment, the encapsulant 14 encapsulates 55% to 70% of an exterior surface area of the at least one solar cell 12. In another embodiment, the encapsulant 14 encapsulates 60% to 70% of an exterior surface area of the at least one solar cell 12. In another embodiment, the encapsulant 14 encapsulates 65% to 70% of an exterior surface area of the at least one solar cell 12.

In another embodiment, the encapsulant 14 encapsulates 50% to 65% of an exterior surface area of the at least one solar cell 12. In another embodiment, the encapsulant 14 encapsulates 55% to 65% of an exterior surface area of the at least one solar cell 12. In another embodiment, the encapsulant 14 encapsulates 60% to 65% of an exterior surface area of the at least one solar cell 12. In another embodiment, the encapsulant 14 encapsulates 50% to 60% of an exterior surface area of the at least one solar cell 12. In another embodiment, the encapsulant 14 encapsulates 55% to 60% of an exterior surface area of the at least one solar cell 12. In another embodiment, the encapsulant 14 encapsulates 55% to 60% of an exterior surface area of the at least one solar cell 12.

In an embodiment, the encapsulant 14 encapsulates 50% of an exterior surface area of the at least one solar cell 12. In another embodiment, the encapsulant 14 encapsulates 55% of the exterior surface area of the at least one solar cell 12. In another embodiment, the encapsulant 14 encapsulates 60% of the exterior surface area of the at least one solar cell 12. In another embodiment, the encapsulant 14 encapsulates 65% of the exterior surface area of the at least one solar cell 12. In another embodiment, the encapsulant 14 encapsulates 70% of the exterior surface area of the at least one solar cell 12. In another embodiment, the encapsulant 14 encapsulates 75% of the exterior surface area of the at least one solar cell 12. In another embodiment, the encapsulant 14 encapsulates 80% of the exterior surface area of the at least one solar cell 12. In another embodiment, the encapsulant 14 encapsulates 85% of the exterior surface area of the at least one solar cell 12. In another embodiment, the encapsulant 14 encapsulates 90% of the exterior surface area of the at least one solar cell 12. In another embodiment, the encapsulant 14 encapsulates 95% of the exterior surface area of the at least one solar cell 12. In another embodiment, the encapsulant 14 encapsulates 100% of the exterior surface area of the at least one solar cell 12.

In an embodiment, the photovoltaic module 10 is adapted to be attached to a roof deck 100. In an embodiment, the at least one solar cell 12 includes a plurality of solar cells 12. In an embodiment, the encapsulant 14 includes a first layer 15 having a first surface 18 and a second layer 17 having a second surface 20. In an embodiment, the frontsheet 16 is juxtaposed with the first surface 18 of the first layer 15 of the encapsulant 14. In an embodiment, the encapsulant 14 may be made from polyolefins, ethyl vinyl acetates, ionomers, silicones, poly vinyl butyral, epoxies, polyurethanes, or combinations/hybrids thereof. In an embodiment, the encapsulant 14 is made from thermosetting polyolefin.

In an embodiment, the encapsulant 14 includes a thickness of 0.4 mm to 1.8 mm. In another embodiment, the encapsulant 14 includes a thickness of 0.4 mm to 1.7 mm. In another embodiment, the encapsulant 14 includes a thickness of 0.4 mm to 1.6 mm. In another embodiment, the encapsulant 14 includes a thickness of 0.4 mm to 1.5 mm. In another embodiment, the encapsulant 14 includes a thickness of 0.4 mm to 1.4 mm. In another embodiment, the encapsulant 14 includes a thickness of 0.4 mm to 1.3 mm. In another embodiment, the encapsulant 14 includes a thickness of 0.4 mm to 1.2 mm. In another embodiment, the encapsulant 14 includes a thickness of 0.4 mm to 1.1 mm. In another embodiment, the encapsulant 14 includes a thickness of 0.4 mm to 1.0 mm. In another embodiment, the encapsulant 14 includes a thickness of 0.4 mm to 0.9 mm. In another embodiment, the encapsulant 14 includes a thickness of 0.4 mm to 0.8 mm. In another embodiment, the encapsulant 14 includes a thickness of 0.4 mm to 0.7 mm. In another embodiment, the encapsulant 14 includes a thickness of 0.4 mm to 0.6 mm. In another embodiment, the encapsulant 14 includes a thickness of 0.4 mm to 0.5 mm.

In an embodiment, the encapsulant 14 includes a thickness of 0.5 mm to 1.8 mm. In another embodiment, the encapsulant 14 includes a thickness of 0.5 mm to 1.7 mm. In another embodiment, the encapsulant 14 includes a thickness of 0.5 mm to 1.6 mm. In another embodiment, the encapsulant 14 includes a thickness of 0.5 mm to 1.5 mm. In another embodiment, the encapsulant 14 includes a thickness of 0.5 mm to 1.4 mm. In another embodiment, the encapsulant 14 includes a thickness of 0.5 mm to 1.3 mm. In another embodiment, the encapsulant 14 includes a thickness of 0.5 mm to 1.2 mm. In another embodiment, the encapsulant 14 includes a thickness of 0.5 mm to 1.1 mm. In another embodiment, the encapsulant 14 includes a thickness of 0.5 mm to 1.0 mm. In another embodiment, the encapsulant 14 includes a thickness of 0.5 mm to 0.9 mm. In another embodiment, the encapsulant 14 includes a thickness of 0.5 mm to 0.8 mm. In another embodiment, the encapsulant 14 includes a thickness of 0.5 mm to 0.7 mm. In another embodiment, the encapsulant 14 includes a thickness of 0.5 mm to 0.6 mm.

In an embodiment, the encapsulant 14 includes a thickness of 0.6 mm to 1.8 mm. In another embodiment, the encapsulant 14 includes a thickness of 0.6 mm to 1.7 mm. In another embodiment, the encapsulant 14 includes a thickness of 0.6 mm to 1.6 mm. In another embodiment, the encapsulant 14 includes a thickness of 0.6 mm to 1.5 mm. In another embodiment, the encapsulant 14 includes a thickness of 0.6 mm to 1.4 mm. In another embodiment, the encapsulant 14 includes a thickness of 0.6 mm to 1.3 mm. In another embodiment, the encapsulant 14 includes a thickness of 0.6 mm to 1.2 mm. In another embodiment, the encapsulant 14 includes a thickness of 0.6 mm to 1.1 mm. In another embodiment, the encapsulant 14 includes a thickness of 0.6 mm to 1.0 mm. In another embodiment, the encapsulant 14 includes a thickness of 0.6 mm to 0.9 mm. In another embodiment, the encapsulant 14 includes a thickness of 0.6 mm to 0.8 mm. In another embodiment, the encapsulant 14 includes a thickness of 0.6 mm to 0.7 mm.

In an embodiment, the encapsulant 14 includes a thickness of 0.7 mm to 1.8 mm. In another embodiment, the encapsulant 14 includes a thickness of 0.7 mm to 1.7 mm. In another embodiment, the encapsulant 14 includes a thickness of 0.7 mm to 1.6 mm. In another embodiment, the encapsulant 14 includes a thickness of 0.7 mm to 1.5 mm. In another embodiment, the encapsulant 14 includes a thickness of 0.7 mm to 1.4 mm. In another embodiment, the encapsulant 14 includes a thickness of 0.7 mm to 1.3 mm. In another embodiment, the encapsulant 14 includes a thickness of 0.7 mm to 1.2 mm. In another embodiment, the encapsulant 14 includes a thickness of 0.7 mm to 1.1 mm. In another embodiment, the encapsulant 14 includes a thickness of 0.7 mm to 1.0 mm. In another embodiment, the encapsulant 14 includes a thickness of 0.7 mm to 0.9 mm. In another embodiment, the encapsulant 14 includes a thickness of 0.7 mm to 0.8 mm.

In an embodiment, the encapsulant 14 includes a thickness of 0.8 mm to 1.8 mm. In another embodiment, the encapsulant 14 includes a thickness of 0.8 mm to 1.7 mm. In another embodiment, the encapsulant 14 includes a thickness of 0.8 mm to 1.6 mm. In another embodiment, the encapsulant 14 includes a thickness of 0.8 mm to 1.5 mm. In another embodiment, the encapsulant 14 includes a thickness of 0.8 mm to 1.4 mm. In another embodiment, the encapsulant 14 includes a thickness of 0.8 mm to 1.3 mm. In another embodiment, the encapsulant 14 includes a thickness of 0.8 mm to 1.2 mm. In another embodiment, the encapsulant 14 includes a thickness of 0.8 mm to 1.1 mm. In another embodiment, the encapsulant 14 includes a thickness of 0.8 mm to 1.0 mm. In another embodiment, the encapsulant 14 includes a thickness of 0.8 mm to 0.9 mm.

In an embodiment, the encapsulant 14 includes a thickness of 0.9 mm to 1.8 mm. In another embodiment, the encapsulant 14 includes a thickness of 0.9 mm to 1.7 mm. In another embodiment, the encapsulant 14 includes a thickness of 0.9 mm to 1.6 mm. In another embodiment, the encapsulant 14 includes a thickness of 0.9 mm to 1.5 mm. In another embodiment, the encapsulant 14 includes a thickness of 0.9 mm to 1.4 mm. In another embodiment, the encapsulant 14 includes a thickness of 0.9 mm to 1.3 mm. In another embodiment, the encapsulant 14 includes a thickness of 0.9 mm to 1.2 mm. In another embodiment, the encapsulant 14 includes a thickness of 0.9 mm to 1.1 mm. In another embodiment, the encapsulant 14 includes a thickness of 0.9 mm to 1.0 mm.

In an embodiment, the encapsulant 14 includes a thickness of 1.0 mm to 1.8 mm. In another embodiment, the encapsulant 14 includes a thickness of 1.0 mm to 1.7 mm. In another embodiment, the encapsulant 14 includes a thickness of 1.0 mm to 1.6 mm. In another embodiment, the encapsulant 14 includes a thickness of 1.0 mm to 1.5 mm. In another embodiment, the encapsulant 14 includes a thickness of 1.0 mm to 1.4 mm. In another embodiment, the encapsulant 14 includes a thickness of 1.0 mm to 1.3 mm. In another embodiment, the encapsulant 14 includes a thickness of 1.0 mm to 1.2 mm. In another embodiment, the encapsulant 14 includes a thickness of 1.0 mm to 1.1 mm.

In an embodiment, the encapsulant 14 includes a thickness of 1.1 mm to 1.8 mm. In another embodiment, the encapsulant 14 includes a thickness of 1.1 mm to 1.7 mm. In another embodiment, the encapsulant 14 includes a thickness of 1.1 mm to 1.6 mm. In another embodiment, the encapsulant 14 includes a thickness of 1.1 mm to 1.5 mm. In another embodiment, the encapsulant 14 includes a thickness of 1.1 mm to 1.4 mm. In another embodiment, the encapsulant 14 includes a thickness of 1.1 mm to 1.3 mm. In another embodiment, the encapsulant 14 includes a thickness of 1.1 mm to 1.2 mm.

In an embodiment, the encapsulant 14 includes a thickness of 1.2 mm to 1.8 mm. In another embodiment, the encapsulant 14 includes a thickness of 1.2 mm to 1.7 mm. In another embodiment, the encapsulant 14 includes a thickness of 1.2 mm to 1.6 mm. In another embodiment, the encapsulant 14 includes a thickness of 1.2 mm to 1.5 mm. In another embodiment, the encapsulant 14 includes a thickness of 1.2 mm to 1.4 mm. In another embodiment, the encapsulant 14 includes a thickness of 1.2 mm to 1.3 mm.

In an embodiment, the encapsulant 14 includes a thickness of 1.3 mm to 1.8 mm. In another embodiment, the encapsulant 14 includes a thickness of 1.3 mm to 1.7 mm. In another embodiment, the encapsulant 14 includes a thickness of 1.3 mm to 1.6 mm. In another embodiment, the encapsulant 14 includes a thickness of 1.3 mm to 1.5 mm. In another embodiment, the encapsulant 14 includes a thickness of 1.3 mm to 1.4 mm.

In an embodiment, the encapsulant 14 includes a thickness of 1.4 mm to 1.8 mm. In another embodiment, the encapsulant 14 includes a thickness of 1.4 mm to 1.7 mm. In another embodiment, the encapsulant 14 includes a thickness of 1.4 mm to 1.6 mm. In another embodiment, the encapsulant 14 includes a thickness of 1.4 mm to 1.5 mm.

In an embodiment, the encapsulant 14 includes a thickness of 1.5 mm to 1.8 mm. In another embodiment, the encapsulant 14 includes a thickness of 1.5 mm to 1.7 mm. In another embodiment, the encapsulant 14 includes a thickness of 1.5 mm to 1.6 mm.

In an embodiment, the encapsulant 14 includes a thickness of 1.6 mm to 1.8 mm. In another embodiment, the encapsulant 14 includes a thickness of 1.6 mm to 1.7 mm. In an embodiment, the encapsulant 14 includes a thickness of 1.7 mm to 1.8 mm.

In an embodiment, the encapsulant 14 includes a thickness of 0.4 mm. In an embodiment, the encapsulant 14 includes a thickness of 0.5 mm. In an embodiment, the encapsulant 14 includes a thickness of 0.6 mm. In an embodiment, the encapsulant 14 includes a thickness of 0.7 mm. In an embodiment, the encapsulant 14 includes a thickness of 0.8 mm. In an embodiment, the encapsulant 14 includes a thickness of 0.9 mm. In an embodiment, the encapsulant 14 includes a thickness of 1.0 mm. In an embodiment, the encapsulant 14 includes a thickness of 1.1 mm. In an embodiment, the encapsulant 14 includes a thickness of 1.2 mm. In an embodiment, the encapsulant 14 includes a thickness of 1.3 mm. In an embodiment, the encapsulant 14 includes a thickness of 1.4 mm. In an embodiment, the encapsulant 14 includes a thickness of 1.5 mm. In an embodiment, the encapsulant 14 includes a thickness of 1.6 mm. In an embodiment, the encapsulant 14 includes a thickness of 1.7 mm. In an embodiment, the encapsulant 14 includes a thickness of 1.8 mm.

In an embodiment, the first layer 15 of the encapsulant 14 includes a thickness of 0.2 mm to 0.9 mm. In another embodiment, the first layer 15 of the encapsulant 14 includes a thickness of 0.2 mm to 0.8 mm. In another embodiment, the first layer 15 of the encapsulant 14 includes a thickness of 0.2 mm to 0.7 mm. In another embodiment, the first layer 15 of the encapsulant 14 includes a thickness of 0.2 mm to 0.6 mm. In another embodiment, the first layer 15 of the encapsulant 14 includes a thickness of 0.2 mm to 0.5 mm. In another embodiment, the first layer 15 of the encapsulant 14 includes a thickness of 0.2 mm to 0.4 mm. In another embodiment, the first layer 15 of the encapsulant 14 includes a thickness of 0.2 mm to 0.3 mm.

In an embodiment, the first layer 15 of the encapsulant 14 includes a thickness of 0.3 mm to 0.9 mm. In another embodiment, the first layer 15 of the encapsulant 14 includes a thickness of 0.3 mm to 0.8 mm. In another embodiment, the first layer 15 of the encapsulant 14 includes a thickness of 0.3 mm to 0.7 mm. In another embodiment, the first layer 15 of the encapsulant 14 includes a thickness of 0.3 mm to 0.6 mm. In another embodiment, the first layer 15 of the encapsulant 14 includes a thickness of 0.3 mm to 0.5 mm. In another embodiment, the first layer 15 of the encapsulant 14 includes a thickness of 0.3 mm to 0.4 mm.

In an embodiment, the first layer 15 of the encapsulant 14 includes a thickness of 0.4 mm to 0.9 mm. In another embodiment, the first layer 15 of the encapsulant 14 includes a thickness of 0.4 mm to 0.8 mm. In another embodiment, the first layer 15 of the encapsulant 14 includes a thickness of 0.4 mm to 0.7 mm. In another embodiment, the first layer 15 of the encapsulant 14 includes a thickness of 0.4 mm to 0.6 mm. In another embodiment, the first layer 15 of the encapsulant 14 includes a thickness of 0.4 mm to 0.5 mm.

In an embodiment, the first layer 15 of the encapsulant 14 includes a thickness of 0.5 mm to 0.9 mm. In another embodiment, the first layer 15 of the encapsulant 14 includes a thickness of 0.5 mm to 0.8 mm. In another embodiment, the first layer 15 of the encapsulant 14 includes a thickness of 0.5 mm to 0.7 mm. In another embodiment, the first layer 15 of the encapsulant 14 includes a thickness of 0.5 mm to 0.6 mm. In an embodiment, the first layer 15 of the encapsulant 14 includes a thickness of 0.6 mm to 0.9 mm. In another embodiment, the first layer 15 of the encapsulant 14 includes a thickness of 0.6 mm to 0.8 mm. In another embodiment, the first layer 15 of the encapsulant 14 includes a thickness of 0.6 mm to 0.7 mm. In an embodiment, the first layer 15 of the encapsulant 14 includes a thickness of 0.7 mm to 0.9 mm. In another embodiment, the first layer 15 of the encapsulant 14 includes a thickness of 0.7 mm to 0.8 mm. In an embodiment, the first layer 15 of the encapsulant 14 includes a thickness of 0.8 mm to 0.9 mm.

In an embodiment, the second layer 17 of the encapsulant 14 includes a thickness of 0.2 mm to 0.9 mm. In another embodiment, the second layer 17 of the encapsulant 14 includes a thickness of 0.2 mm to 0.8 mm. In another embodiment, the second layer 17 of the encapsulant 14 includes a thickness of 0.2 mm to 0.7 mm. In another embodiment, the second layer 17 of the encapsulant 14 includes a thickness of 0.2 mm to 0.6 mm. In another embodiment, the second layer 17 of the encapsulant 14 includes a thickness of 0.2 mm to 0.5 mm. In another embodiment, the second layer 17 of the encapsulant 14 includes a thickness of 0.2 mm to 0.4 mm. In another embodiment, the second layer 17 of the encapsulant 14 includes a thickness of 0.2 mm to 0.3 mm.

In an embodiment, the second layer 17 of the encapsulant 14 includes a thickness of 0.3 mm to 0.9 mm. In another embodiment, the second layer 17 of the encapsulant 14 includes a thickness of 0.3 mm to 0.8 mm. In another embodiment, the second layer 17 of the encapsulant 14 includes a thickness of 0.3 mm to 0.7 mm. In another embodiment, the second layer 17 of the encapsulant 14 includes a thickness of 0.3 mm to 0.6 mm. In another embodiment, the second layer 17 of the encapsulant 14 includes a thickness of 0.3 mm to 0.5 mm. In another embodiment, the second layer 17 of the encapsulant 14 includes a thickness of 0.3 mm to 0.4 mm.

In an embodiment, the second layer 17 of the encapsulant 14 includes a thickness of 0.4 mm to 0.9 mm. In another embodiment, the second layer 17 of the encapsulant 14 includes a thickness of 0.4 mm to 0.8 mm. In another embodiment, the second layer 17 of the encapsulant 14 includes a thickness of 0.4 mm to 0.7 mm. In another embodiment, the second layer 17 of the encapsulant 14 includes a thickness of 0.4 mm to 0.6 mm. In another embodiment, the second layer 17 of the encapsulant 14 includes a thickness of 0.4 mm to 0.5 mm.

In an embodiment, the second layer 17 of the encapsulant 14 includes a thickness of 0.5 mm to 0.9 mm. In another embodiment, the second layer 17 of the encapsulant 14 includes a thickness of 0.5 mm to 0.8 mm. In another embodiment, the second layer 17 of the encapsulant 14 includes a thickness of 0.5 mm to 0.7 mm. In another embodiment, the second layer 17 of the encapsulant 14 includes a thickness of 0.5 mm to 0.6 mm. In an embodiment, the second layer 17 of the encapsulant 14 includes a thickness of 0.6 mm to 0.9 mm. In another embodiment, the second layer 17 of the encapsulant 14 includes a thickness of 0.6 mm to 0.8 mm. In another embodiment, the second layer 17 of the encapsulant 14 includes a thickness of 0.6 mm to 0.7 mm. In an embodiment, the second layer 17 of the encapsulant 14 includes a thickness of 0.7 mm to 0.9 mm. In another embodiment, the second layer 17 of the encapsulant 14 includes a thickness of 0.7 mm to 0.8 mm. In an embodiment, the second layer 17 of the encapsulant 14 includes a thickness of 0.8 mm to 0.9 mm.

In an embodiment, the thickness of the first layer 15 is equal to the thickness of the second layer 17. In another embodiment, the thickness of the first layer 15 is different from the thickness of the second layer 17.

Referring to FIG. 1, in an embodiment, the frontsheet 16 includes a glass layer 22 having a first surface 24 and a second surface 26 opposite the first surface 24 of the glass layer 22, and a polymer layer 28 attached to the first surface 24 of the glass layer 22. In an embodiment, the second surface 26 of the glass layer 22 is juxtaposed with the first surface 18 of the encapsulant 14. In an embodiment, each of the glass layer 22 and the polymer layer 28 is transparent. In an embodiment, the polymer layer 28 is attached to the glass layer 22 by an adhesive layer 30. In an embodiment, the adhesive layer 30 may include polyvinyl butyrate, acrylic, silicone, or polycarbonate. In another embodiment, the adhesive layer 30 may include pressure sensitive adhesives. In another embodiment, the polymer layer 28 is attached to the glass layer 22 by thermal bonding. In another embodiment, the frontsheet 16 includes at least one of the glass layer 22 or the polymer layer 28.

In an embodiment, the adhesive layer 30 includes thermosetting polyolefin, thermosetting polyolefin encapsulant material, thermosetting ethylene-vinyl acetate (EVA), EVA encapsulants, thermoplastic olefin, thermoplastic polyolefin (TPO) or hybrids/combinations thereof.

In an embodiment, the adhesive layer 30 includes a thickness of 1 µm to 900 µm. In an embodiment, the adhesive layer 30 includes a thickness of 1 µm to 850 µm. In an embodiment, the adhesive layer 30 includes a thickness of 1 µm to 800 µm. In an embodiment, the adhesive layer 30 includes a thickness of 1 µm to 750 µm. In an embodiment, the adhesive layer 30 includes a thickness of 1 µm to 700 µm. In an embodiment, the adhesive layer 30 includes a thickness of 1 µm to 650 µm. In an embodiment, the adhesive layer 30 includes a thickness of 1 µm to 600 µm. In an embodiment, the adhesive layer 30 includes a thickness of 1 µm to 550 µm. In an embodiment, the adhesive layer 30 includes a thickness of 1 µm to 500 µm. In an embodiment, the adhesive layer 30 includes a thickness of 1 µm to 450 µm. In an embodiment, the adhesive layer 30 includes a thickness of 1 µm to 400 µm. In an embodiment, the adhesive layer 30 includes a thickness of 1 µm to 350 µm. In an embodiment, the adhesive layer 30 includes a thickness of 1 µm to 300 µm. In an embodiment, the adhesive layer 30 includes a thickness of 1 µm to 250 µm. In an embodiment, the adhesive layer 30 includes a thickness of 1 µm to 200 µm. In an embodiment, the adhesive layer 30 includes a thickness of 1 µm to 150 µm. In an embodiment, the adhesive layer 30 includes a thickness of 1 µm to 100 µm. In an embodiment, the adhesive layer 30 includes a thickness of 1 µm to 50 µm.

In an embodiment, the adhesive layer 30 includes a thickness of 50 µm to 900 µm. In an embodiment, the adhesive layer 30 includes a thickness of 50 µm to 850 µm. In an embodiment, the adhesive layer 30 includes a thickness of 50 µm to 800 µm. In an embodiment, the adhesive layer 30 includes a thickness of 50 µm to 750 µm. In an embodiment, the adhesive layer 30 includes a thickness of 50 µm to 700 µm. In an embodiment, the adhesive layer 30 includes a thickness of 50 µm to 650 µm. In an embodiment, the adhesive layer 30 includes a thickness of 50 µm to 600 µm. In an embodiment, the adhesive layer 30 includes a thickness of 50 µm to 550 µm. In an embodiment, the adhesive layer 30 includes a thickness of 50 µm to 500 µm. In an embodiment, the adhesive layer 30 includes a thickness of 50 µm to 450 µm. In an embodiment, the adhesive layer 30 includes a thickness of 50 µm to 400 µm. In an embodiment, the adhesive layer 30 includes a thickness of 50 µm to 350 µm. In an embodiment, the adhesive layer 30 includes a thickness of 50 µm to 300 µm. In an embodiment, the adhesive layer 30 includes a thickness of 50 µm to 250 µm. In an embodiment, the adhesive layer 30 includes a thickness of 50 µm to 200 µm. In an embodiment, the adhesive layer 30 includes a thickness of 50 µm to 150 µm. In an embodiment, the adhesive layer 30 includes a thickness of 50 µm to 100 µm.

In an embodiment, the adhesive layer 30 includes a thickness of 100 µm to 900 µm. In an embodiment, the adhesive layer 30 includes a thickness of 100 µm to 850 µm. In an embodiment, the adhesive layer 30 includes a thickness of 100 µm to 800 µm. In an embodiment, the adhesive layer 30 includes a thickness of 100 µm to 750 µm. In an embodiment, the adhesive layer 30 includes a thickness of 100 µm to 700 µm. In an embodiment, the adhesive layer 30 includes a thickness of 100 µm to 650 µm. In an embodiment, the adhesive layer 30 includes a thickness of 100 µm to 600 µm. In an embodiment, the adhesive layer 30 includes a thickness of 100 µm to 550 µm. In an embodiment, the adhesive layer 30 includes a thickness of 100 µm to 500 µm. In an embodiment, the adhesive layer 30 includes a thickness of 100 µm to 450 µm. In an embodiment, the adhesive layer 30 includes a thickness of 100 µm to 400 µm. In an embodiment, the adhesive layer 30 includes a thickness of 100 µm to 350 µm. In an embodiment, the adhesive layer 30 includes a thickness of 100 µm to 300 µm. In an embodiment, the adhesive layer 30 includes a thickness of 100 µm to 250 µm. In an embodiment, the adhesive layer 30 includes a thickness of 100 µm to 200 µm. In an embodiment, the adhesive layer 30 includes a thickness of 100 µm to 150 µm.

In an embodiment, the adhesive layer 30 includes a thickness of 150 µm to 900 µm. In an embodiment, the adhesive layer 30 includes a thickness of 150 µm to 850 µm. In an embodiment, the adhesive layer 30 includes a thickness of 150 µm to 800 µm. In an embodiment, the adhesive layer 30 includes a thickness of 150 µm to 750 µm. In an embodiment, the adhesive layer 30 includes a thickness of 150 µm to 700 µm. In an embodiment, the adhesive layer 30 includes a thickness of 150 µm to 650 µm. In an embodiment, the adhesive layer 30 includes a thickness of 150 µm to 600 µm. In an embodiment, the adhesive layer 30 includes a thickness of 150 µm to 550 µm. In an embodiment, the adhesive layer 30 includes a thickness of 150 µm to 500 µm. In an embodiment, the adhesive layer 30 includes a thickness of 150 µm to 450 µm. In an embodiment, the adhesive layer 30 includes a thickness of 150 µm to 400 µm. In an embodiment, the adhesive layer 30 includes a thickness of 150 µm to 350 µm. In an embodiment, the adhesive layer 30 includes a thickness of 150 µm to 300 µm. In an embodiment, the adhesive layer 30 includes a thickness of 150 µm to 250 µm. In an embodiment, the adhesive layer 30 includes a thickness of 150 µm to 200 µm.

In an embodiment, the adhesive layer 30 includes a thickness of 200 µm to 900 µm. In an embodiment, the adhesive layer 30 includes a thickness of 200 µm to 850 µm. In an embodiment, the adhesive layer 30 includes a thickness of 200 µm to 800 µm. In an embodiment, the adhesive layer 30 includes a thickness of 200 µm to 750 µm. In an embodiment, the adhesive layer 30 includes a thickness of 200 µm to 700 µm. In an embodiment, the adhesive layer 30 includes a thickness of 200 µm to 650 µm. In an embodiment, the adhesive layer 30 includes a thickness of 200 µm to 600 µm. In an embodiment, the adhesive layer 30 includes a thickness of 200 µm to 550 µm. In an embodiment, the adhesive layer 30 includes a thickness of 200 µm to 500 µm. In an embodiment, the adhesive layer 30 includes a thickness of 200 µm to 450 µm. In an embodiment, the adhesive layer 30 includes a thickness of 200 µm to 400 µm. In an embodiment, the adhesive layer 30 includes a thickness of 200 µm to 350 µm. In an embodiment, the adhesive layer 30 includes a thickness of 200 µm to 300 µm. In an embodiment, the adhesive layer 30 includes a thickness of 200 µm to 250 µm.

In an embodiment, the adhesive layer 30 includes a thickness of 250 µm to 900 µm. In an embodiment, the adhesive layer 30 includes a thickness of 250 µm to 850 µm. In an embodiment, the adhesive layer 30 includes a thickness of 250 µm to 800 µm. In an embodiment, the adhesive layer 30 includes a thickness of 250 µm to 750 µm. In an embodiment, the adhesive layer 30 includes a thickness of 250 µm to 700 µm. In an embodiment, the adhesive layer 30 includes a thickness of 250 µm to 650 µm. In an embodiment, the adhesive layer 30 includes a thickness of 250 µm to 600 µm. In an embodiment, the adhesive layer 30 includes a thickness of 250 µm to 550 µm. In an embodiment, the adhesive layer 30 includes a thickness of 250 µm to 500 µm. In an embodiment, the adhesive layer 30 includes a thickness of 250 µm to 450 µm. In an embodiment, the adhesive layer 30 includes a thickness of 250 µm to 400 µm. In an embodiment, the adhesive layer 30 includes a thickness of 250 µm to 350 µm. In an embodiment, the adhesive layer 30 includes a thickness of 250 µm to 300 µm.

In an embodiment, the adhesive layer 30 includes a thickness of 300 µm to 900 µm. In an embodiment, the adhesive layer 30 includes a thickness of 300 µm to 850 µm. In an embodiment, the adhesive layer 30 includes a thickness of 300 µm to 800 µm. In an embodiment, the adhesive layer 30 includes a thickness of 300 µm to 750 µm. In an embodiment, the adhesive layer 30 includes a thickness of 300 µm to 700 µm. In an embodiment, the adhesive layer 30 includes a thickness of 300 µm to 650 µm. In an embodiment, the adhesive layer 30 includes a thickness of 300 µm to 600 µm. In an embodiment, the adhesive layer 30 includes a thickness of 300 µm to 550 µm. In an embodiment, the adhesive layer 30 includes a thickness of 300 µm to 500 µm. In an embodiment, the adhesive layer 30 includes a thickness of 300 µm to 450 µm. In an embodiment, the adhesive layer 30 includes a thickness of 300 µm to 400 µm. In an embodiment, the adhesive layer 30 includes a thickness of 300 µm to 350 µm.

In an embodiment, the adhesive layer 30 includes a thickness of 350 µm to 900 µm. In an embodiment, the adhesive layer 30 includes a thickness of 350 µm to 850 µm. In an embodiment, the adhesive layer 30 includes a thickness of 350 µm to 800 µm. In an embodiment, the adhesive layer 30 includes a thickness of 350 µm to 750 µm. In an embodiment, the adhesive layer 30 includes a thickness of 350 µm to 700 µm. In an embodiment, the adhesive layer 30 includes a thickness of 350 µm to 650 µm. In an embodiment, the adhesive layer 30 includes a thickness of 350 µm to 600 µm. In an embodiment, the adhesive layer 30 includes a thickness of 350 µm to 550 µm. In an embodiment, the adhesive layer 30 includes a thickness of 350 µm to 500 µm. In an embodiment, the adhesive layer 30 includes a thickness of 350 µm to 450 µm. In an embodiment, the adhesive layer 30 includes a thickness of 350 µm to 400 µm.

In an embodiment, the adhesive layer 30 includes a thickness of 400 µm to 900 µm. In an embodiment, the adhesive layer 30 includes a thickness of 400 µm to 850 µm. In an embodiment, the adhesive layer 30 includes a thickness of 400 µm to 800 µm. In an embodiment, the adhesive layer 30 includes a thickness of 400 µm to 750 µm. In an embodiment, the adhesive layer 30 includes a thickness of 400 µm to 700 µm. In an embodiment, the adhesive layer 30 includes a thickness of 400 µm to 650 µm. In an embodiment, the adhesive layer 30 includes a thickness of 400 µm to 600 µm. In an embodiment, the adhesive layer 30 includes a thickness of 400 µm to 550 µm. In an embodiment, the adhesive layer 30 includes a thickness of 400 µm to 500 µm. In an embodiment, the adhesive layer 30 includes a thickness of 400 µm to 450 µm.

In an embodiment, the adhesive layer 30 includes a thickness of 450 µm to 900 µm. In an embodiment, the adhesive layer 30 includes a thickness of 450 µm to 850 µm. In an embodiment, the adhesive layer 30 includes a thickness of 450 µm to 800 µm. In an embodiment, the adhesive layer 30 includes a thickness of 450 µm to 750 µm. In an embodiment, the adhesive layer 30 includes a thickness of 450 µm to 700 µm. In an embodiment, the adhesive layer 30 includes a thickness of 450 µm to 650 µm. In an embodiment, the adhesive layer 30 includes a thickness of 450 µm to 600 µm. In an embodiment, the adhesive layer 30 includes a thickness of 450 µm to 550 µm. In an embodiment, the adhesive layer 30 includes a thickness of 450 µm to 500 µm.

In an embodiment, the adhesive layer 30 includes a thickness of 500 µm to 900 µm. In an embodiment, the adhesive layer 30 includes a thickness of 500 µm to 850 µm. In an embodiment, the adhesive layer 30 includes a thickness of 500 µm to 800 µm. In an embodiment, the adhesive layer 30 includes a thickness of 500 µm to 750 µm. In an embodiment, the adhesive layer 30 includes a thickness of 500 μm to 700 μm. In an embodiment, the adhesive layer 30 includes a thickness of 500 μm to 650 μm. In an embodiment, the adhesive layer 30 includes a thickness of 500 μm to 600 μm. In an embodiment, the adhesive layer 30 includes a thickness of 500 μm to 550 μm.

In an embodiment, the adhesive layer 30 includes a thickness of 550 μm to 900 μm. In an embodiment, the adhesive layer 30 includes a thickness of 550 μm to 850 μm. In an embodiment, the adhesive layer 30 includes a thickness of 550 μm to 800 μm. In an embodiment, the adhesive layer 30 includes a thickness of 550 μm to 750 μm. In an embodiment, the adhesive layer 30 includes a thickness of 550 μm to 700 μm. In an embodiment, the adhesive layer 30 includes a thickness of 550 μm to 650 μm. In an embodiment, the adhesive layer 30 includes a thickness of 550 μm to 600 μm.

In an embodiment, the adhesive layer 30 includes a thickness of 600 μm to 900 μm. In an embodiment, the adhesive layer 30 includes a thickness of 600 μm to 850 μm. In an embodiment, the adhesive layer 30 includes a thickness of 600 μm to 800 μm. In an embodiment, the adhesive layer 30 includes a thickness of 600 μm to 750 μm. In an embodiment, the adhesive layer 30 includes a thickness of 600 μm to 700 μm. In an embodiment, the adhesive layer 30 includes a thickness of 600 μm to 650 μm.

In an embodiment, the adhesive layer 30 includes a thickness of 650 μm to 900 μm. In an embodiment, the adhesive layer 30 includes a thickness of 650 μm to 850 μm. In an embodiment, the adhesive layer 30 includes a thickness of 650 μm to 800 μm. In an embodiment, the adhesive layer 30 includes a thickness of 650 μm to 750 μm. In an embodiment, the adhesive layer 30 includes a thickness of 650 μm to 700 μm.

In an embodiment, the adhesive layer 30 includes a thickness of 700 μm to 900 μm. In an embodiment, the adhesive layer 30 includes a thickness of 700 μm to 850 μm. In an embodiment, the adhesive layer 30 includes a thickness of 700 μm to 800 μm. In an embodiment, the adhesive layer 30 includes a thickness of 700 μm to 750 μm.

In an embodiment, the adhesive layer 30 includes a thickness of 750 μm to 900 μm. In an embodiment, the adhesive layer 30 includes a thickness of 750 μm to 850 μm. In an embodiment, the adhesive layer 30 includes a thickness of 750 μm to 800 μm. In an embodiment, the adhesive layer 30 includes a thickness of 800 μm to 900 μm. In an embodiment, the adhesive layer 30 includes a thickness of 800 μm to 850 μm. In an embodiment, the adhesive layer 30 includes a thickness of 850 μm to 900 μm.

In an embodiment, the adhesive layer 30 includes a thickness of 1 μm. In an embodiment, the adhesive layer 30 includes a thickness of 50 μm. In an embodiment, the adhesive layer 30 includes a thickness of 100 μm. In an embodiment, the adhesive layer 30 includes a thickness of 1 μm. In an embodiment, the adhesive layer 30 includes a thickness of 150 μm. In an embodiment, the adhesive layer 30 includes a thickness of 200 μm. In an embodiment, the adhesive layer 30 includes a thickness of 250 μm. In an embodiment, the adhesive layer 30 includes a thickness of 300 μm. In an embodiment, the adhesive layer 30 includes a thickness of 350 μm. In an embodiment, the adhesive layer 30 includes a thickness of 400 μm. In an embodiment, the adhesive layer 30 includes a thickness of 450 μm. In an embodiment, the adhesive layer 30 includes a thickness of 500 μm. In an embodiment, the adhesive layer 30 includes a thickness of 550 μm. In an embodiment, the adhesive layer 30 includes a thickness of 600 μm. In an embodiment, the adhesive layer 30 includes a thickness of 650 μm. In an embodiment, the adhesive layer 30 includes a thickness of 700 μm. In an embodiment, the adhesive layer 30 includes a thickness of 750 μm. In an embodiment, the adhesive layer 30 includes a thickness of 800 μm. In an embodiment, the adhesive layer 30 includes a thickness of 850 μm. In an embodiment, the adhesive layer 30 includes a thickness of 900 μm.

In an embodiment, the adhesive layer 30 includes a single layer. In another embodiment, the adhesive layer 30 includes a plurality of layers.

In an embodiment, the polymer layer 28 includes a fluoropolymer. In certain embodiments, the fluoropolymer may be ethylene tetrafluoroethylene (ETFE), fluoropolymer is polyvinylidene fluoride (PVDF), tetrafluoroethylene-hexafluoropropylene copolymers (FEP), and tetrafluoroethylene-hexafluoropropylene-vinylidene fluoride copolymers (THV), polyvinyl fluoride (PVF), or blends thereof. In an embodiment, the polymer layer 28 includes fluoropolymers, acrylics, polyesters, silicones, polycarbonates, or combinations thereof. In other embodiments, the polymer layer 28 includes polyethylene terephthalate (PET), polyethylene naphthalate (PEN), polyetheretherketone (PEEK), polyaryletherketone (PAEK), polyarylate (PAR), polyetherimide (PEI), polyarylsulfone (PAS), polyethersulfone (PES), polyamideimide (PAI), polyphenylsulfone (PPSU), polyolefin, cyclic olefin copolymers (CPCs), or polyimide.

In an embodiment, the polymer layer 28 includes a crosslinked polymeric material. In an embodiment, 50% to 99% of the polymer chains of the polymeric material are crosslinked. In another embodiment, 55% to 99% of the polymer chains of the polymeric material are crosslinked. In another embodiment, 60% to 99% of the polymer chains of the polymeric material are crosslinked. In another embodiment, 65% to 99% of the polymer chains of the polymeric material are crosslinked. In another embodiment, 70% to 99% of the polymer chains of the polymeric material are crosslinked. In another embodiment, 75% to 99% of the polymer chains of the polymeric material are crosslinked. In another embodiment, 80% to 99% of the polymer chains of the polymeric material are crosslinked. In another embodiment, 85% to 99% of the polymer chains of the polymeric material are crosslinked. In another embodiment, 90% to 99% of the polymer chains of the polymeric material are crosslinked. In another embodiment, 95% to 99% of the polymer chains of the polymeric material are crosslinked. In another embodiment, 50% to 95% of the polymer chains of the polymeric material are crosslinked. In another embodiment, 50% to 90% of the polymer chains of the polymeric material are crosslinked. In another embodiment, 50% to 85% of the polymer chains of the polymeric material are crosslinked. In another embodiment, 50% to 80% of the polymer chains of the polymeric material are crosslinked. In another embodiment, 50% to 75% of the polymer chains of the polymeric material are crosslinked. In another embodiment, 50% to 70% of the polymer chains of the polymeric material are crosslinked. In another embodiment, 50% to 65% of the polymer chains of the polymeric material are crosslinked. In another embodiment, 50% to 60% of the polymer chains of the polymeric material are crosslinked. In another embodiment, 50% to 55% of the polymer chains of the polymeric material are crosslinked.

In another embodiment, 55% to 95% of the polymer chains of the polymeric material are crosslinked. In another embodiment, 55% to 90% of the polymer chains of the polymeric material are crosslinked. In another embodiment, 55% to 85% of the polymer chains of the polymeric material are crosslinked. In another embodiment, 55% to 80% of the polymer chains of the polymeric material are crosslinked. In another embodiment, 55% to 75% of the polymer chains of the polymeric material are crosslinked. In another embodiment, 55% to 70% of the polymer chains of the polymeric material are crosslinked. In another embodiment, 55% to 65% of the polymer chains of the polymeric material are crosslinked. In another embodiment, 55% to 60% of the polymer chains of the polymeric material are crosslinked.

In another embodiment, 60% to 95% of the polymer chains of the polymeric material are crosslinked. In another embodiment, 60% to 90% of the polymer chains of the polymeric material are crosslinked. In another embodiment, 60% to 85% of the polymer chains of the polymeric material are crosslinked. In another embodiment, 60% to 80% of the polymer chains of the polymeric material are crosslinked. In another embodiment, 60% to 75% of the polymer chains of the polymeric material are crosslinked. In another embodiment, 60% to 70% of the polymer chains of the polymeric material are crosslinked. In another embodiment, 60% to 65% of the polymer chains of the polymeric material are crosslinked.

In another embodiment, 65% to 95% of the polymer chains of the polymeric material are crosslinked. In another embodiment, 65% to 90% of the polymer chains of the polymeric material are crosslinked. In another embodiment, 60% to 85% of the polymer chains of the polymeric material are crosslinked. In another embodiment, 65% to 80% of the polymer chains of the polymeric material are crosslinked. In another embodiment, 65% to 75% of the polymer chains of the polymeric material are crosslinked. In another embodiment, 65% to 70% of the polymer chains of the polymeric material are crosslinked.

In another embodiment, 70% to 95% of the polymer chains of the polymeric material are crosslinked. In another embodiment, 70% to 90% of the polymer chains of the polymeric material are crosslinked. In another embodiment, 70% to 85% of the polymer chains of the polymeric material are crosslinked. In another embodiment, 70% to 80% of the polymer chains of the polymeric material are crosslinked. In another embodiment, 70% to 75% of the polymer chains of the polymeric material are crosslinked.

In another embodiment, 75% to 95% of the polymer chains of the polymeric material are crosslinked. In another embodiment, 75% to 90% of the polymer chains of the polymeric material are crosslinked. In another embodiment, 75% to 85% of the polymer chains of the polymeric material are crosslinked. In another embodiment, 75% to 90% of the polymer chains of the polymeric material are crosslinked.

In another embodiment, 80% to 95% of the polymer chains of the polymeric material are crosslinked. In another embodiment, 80% to 90% of the polymer chains of the polymeric material are crosslinked. In another embodiment, 80% to 85% of the polymer chains of the polymeric material are crosslinked. In another embodiment, 85% to 95% of the polymer chains of the polymeric material are crosslinked. In another embodiment, 85% to 90% of the polymer chains of the polymeric material are crosslinked. In another embodiment, 90% to 95% of the polymer chains of the polymeric material are crosslinked.

In an embodiment, the polymeric material of the polymer layer 28 is crosslinked by an electron beam. In another embodiment, the polymeric material is crosslinked by gamma radiation.

In an embodiment, the glass layer 22 includes a thickness of 2.5 mm to 4 mm. In another embodiment, the glass layer 22 includes a thickness of 2.5 mm to 3.5 mm. In another embodiment, the glass layer 22 includes a thickness of 2.5 mm to 3 mm. In another embodiment, the glass layer 22 includes a thickness of 3 mm to 4 mm. In another embodiment, the glass layer 22 includes a thickness of 3.5 mm to 4 mm. In another embodiment, the glass layer 22 includes a thickness of 2.6 mm to 3.5 mm. In another embodiment, the glass layer 22 includes a thickness of 2.7 mm to 3.5 mm. In another embodiment, the glass layer 22 includes a thickness of 2.8 mm to 3.5 mm. In another embodiment, the glass layer 22 includes a thickness of 2.9 mm to 3.5 mm. In another embodiment, the glass layer 22 includes a thickness of 3 mm to 3.5 mm. In another embodiment, the glass layer 22 includes a thickness of 3.1 mm to 3.5 mm. In another embodiment, the glass layer 22 includes a thickness of 3.2 mm to 3.5 mm. In another embodiment, the glass layer 22 includes a thickness of 3.3 mm to 3.5 mm. In another embodiment, the glass layer 22 includes a thickness of 3.4 mm to 3.5 mm. In another embodiment, the glass layer 22 includes a thickness of 2.5 mm to 3.4 mm. In another embodiment, the glass layer 22 includes a thickness of 2.5 mm to 3.3 mm. In another embodiment, the glass layer 22 includes a thickness of 2.5 mm to 3.2 mm. In another embodiment, the glass layer 22 includes a thickness of 2.5 mm to 3.1 mm. In another embodiment, the glass layer 22 includes a thickness of 2.5 mm to 2.9 mm. In another embodiment, the glass layer 22 includes a thickness of 2.5 mm to 2.8 mm. In another embodiment, the glass layer 22 includes a thickness of 2.5 mm to 2.7 mm. In another embodiment, the glass layer 22 includes a thickness of 2.5 mm to 2.6 mm.

In another embodiment, the glass layer 22 includes a thickness of 2.5 mm. In another embodiment, the glass layer 22 includes a thickness of 2.6 mm. In another embodiment, the glass layer 22 includes a thickness of 2.7 mm. In another embodiment, the glass layer 22 includes a thickness of 2.8 mm. In another embodiment, the glass layer 22 includes a thickness of 2.9 mm. In another embodiment, the glass layer 22 includes a thickness of 3 mm. In another embodiment, the glass layer 22 includes a thickness of 3.1 mm. In another embodiment, the glass layer 22 includes a thickness of 3.2 mm. In another embodiment, the glass layer 22 includes a thickness of 3.3 mm. In another embodiment, the glass layer 22 includes a thickness of 3.4 mm. In another embodiment, the glass layer 22 includes a thickness of 3.5 mm. In another embodiment, the glass layer 22 includes a thickness of 3.6 mm. In another embodiment, the glass layer 22 includes a thickness of 3.7 mm. In another embodiment, the glass layer 22 includes a thickness of 3.8 mm. In another embodiment, the glass layer 22 includes a thickness of 3.9 mm. In another embodiment, the glass layer 22 includes a thickness of 4 mm.

In an embodiment, the polymer layer 28 includes a thickness of 0.01 mm to 0.5 mm. In another embodiment, the polymer layer 28 includes a thickness of 0.01 mm to 0.4 mm. In another embodiment, the polymer layer 28 includes a thickness of 0.01 mm to 0.3 mm. In another embodiment, the polymer layer 28 includes a thickness of 0.01 mm to 0.2 mm. In another embodiment, the polymer layer 28 includes a thickness of 0.01 mm to 0.1 mm. In another embodiment, the polymer layer 28 includes a thickness of 0.01 mm to 0.09 mm. In another embodiment, the polymer layer 28 includes a thickness of 0.01 mm to 0.08 mm. In another embodiment, the polymer layer 28 includes a thickness of 0.01 mm to 0.07 mm. In another embodiment, the polymer layer 28 includes a thickness of 0.01 mm to 0.06 mm. In another embodiment, the polymer layer 28 includes a thickness of 0.01 mm to 0.05 mm. In another embodiment, the polymer layer 28 includes a thickness of 0.01 mm to 0.04 mm. In another embodiment, the polymer layer 28 includes a thickness of 0.01 mm to 0.03 mm. In another embodiment, the polymer layer 28 includes a thickness of 0.01 mm to 0.02 mm.

In another embodiment, the polymer layer 28 includes a thickness of 0.01 mm to 0.4 mm. In another embodiment, the polymer layer 28 includes a thickness of 0.02 mm to 0.4 mm. In another embodiment, the polymer layer 28 includes a thickness of 0.03 mm to 0.4 mm. In another embodiment, the polymer layer 28 includes a thickness of 0.04 mm to 0.4 mm. In another embodiment, the polymer layer 28 includes a thickness of 0.05 mm to 0.4 mm. In another embodiment, the polymer layer 28 includes a thickness of 0.06 mm to 0.4 mm. In another embodiment, the polymer layer 28 includes a thickness of 0.07 mm to 0.4 mm. In another embodiment, the polymer layer 28 includes a thickness of 0.08 mm to 0.4 mm. In another embodiment, the polymer layer 28 includes a thickness of 0.09 mm to 0.4 mm. In another embodiment, the polymer layer 28 includes a thickness of 0.1 mm to 0.4 mm. In another embodiment, the polymer layer 28 includes a thickness of 0.15 mm to 0.4 mm. In another embodiment, the polymer layer 28 includes a thickness of 0.2 mm to 0.4 mm. In another embodiment, the polymer layer 28 includes a thickness of 0.25 mm to 0.4 mm. In another embodiment, the polymer layer 28 includes a thickness of 0.3 mm to 0.4 mm. In another embodiment, the polymer layer 28 includes a thickness of 0.35 mm to 0.4 mm.

In another embodiment, the polymer layer 28 includes a thickness of 0.025 mm to 0.1 mm. In another embodiment, the polymer layer 28 includes a thickness of 0.03 mm to 0.1 mm. In another embodiment, the polymer layer 28 includes a thickness of 0.035 mm to 0.1 mm. In another embodiment, the polymer layer 28 includes a thickness of 0.04 mm to 0.1 mm. In another embodiment, the polymer layer 28 includes a thickness of 0.045 mm to 0.1 mm. In another embodiment, the polymer layer 28 includes a thickness of 0.05 mm to 0.1 mm. In another embodiment, the polymer layer 28 includes a thickness of 0.06 mm to 0.1 mm. In another embodiment, the polymer layer 28 includes a thickness of 0.065 mm to 0.1 mm. In another embodiment, the polymer layer 28 includes a thickness of 0.07 mm to 0.1 mm. In another embodiment, the polymer layer 28 includes a thickness of 0.075 mm to 0.1 mm. In another embodiment, the polymer layer 28 includes a thickness of 0.08 mm to 0.1 mm. In another embodiment, the polymer layer 28 includes a thickness of 0.085 mm to 0.1 mm. In another embodiment, the polymer layer 28 includes a thickness of 0.09 mm to 0.1 mm. In another embodiment, the polymer layer 28 includes a thickness of 0.095 mm to 0.1 mm.

Referring to FIG. 1, in an embodiment, the photovoltaic module 10 includes a backsheet 32 juxtaposed with the second surface 20 of the encapsulant 14. In an embodiment, the backsheet 32 includes a single layer, moisture-resistant, fire-retardant membrane 38. In an embodiment, the membrane 38 is the sole fire-retardant layer in the photovoltaic module 10. In an embodiment, the membrane 38 includes a first surface 34 and a second surface 36 opposite the first surface 34. In an embodiment, the first surface 34 of the membrane 38 is juxtaposed with the second surface 20 of the encapsulant 14 and the second surface 36 of the membrane 38 is juxtaposed with the roof deck 100.

In an embodiment, the membrane 38 includes thermoplastic polyolefin (TPO). In another embodiment, the membrane 38 includes a single ply TPO roofing membrane. In other embodiments, non-limiting examples of TPO membranes are disclosed in U.S. Pat. No. 9,359,014 to Yang et al., which is incorporated by reference herein in its entirety.

In another embodiment, the membrane 38 includes polyvinyl chloride. In an embodiment, the membrane 38 includes ethylene propylene diene monomer (EPDM) rubber. In an embodiment, the membrane 38 includes a flame retardant additive. In some embodiments, the flame retardant additive may be clays, nanoclays, silicas, carbon black, metal hydroxides such as aluminum hydroxide, metal foils, graphite, and combinations thereof.

In another embodiment, the backsheet 32 includes a first ply and a second ply. In other embodiments, the backsheet 32 includes a plurality of layers. In other embodiments, the photovoltaic module 10 may include more than one backsheet 32.

In an embodiment, the photovoltaic module 10 is adapted to be a component of a photovoltaic system that includes a fire resistance that conforms to standards under UL 790/ASTM E 108 test standards. In an embodiment, the photovoltaic module 10 includes a Class A rating when tested in accordance with UL 790/ASTM E 108.

As used herein, the term "fire-retardant" means a material having a V-0, V-1, or V-2 rating when tested in accordance with UL 94. In an embodiment, the backsheet 32 includes a V-0 rating when tested in accordance with UL 94. In an embodiment, the backsheet 32 includes a V-1 rating when tested in accordance with UL 94. In an embodiment, the backsheet 32 includes a V-2 rating when tested in accordance with UL 94.

As used herein, the term "moisture resistant" means having a water transmission rate of less than or equal to 0.05 U.S. perm, as measured by ASTM E 96, Procedure B—Standard Test Methods for Water Vapor Transmission of Materials. In an embodiment, the backsheet 32 includes a water vapor transmission rate in a range between 0.01 perm and 0.05 U.S. perm. In an embodiment, the backsheet 32 includes a water vapor transmission rate in a range between 0.01 perm and 0.04 U.S. perm. In an embodiment, the backsheet 32 includes a water vapor transmission rate in a range between 0.01 perm and 0.03 U.S. perm. In an embodiment, the backsheet 32 includes a water vapor transmission rate in a range between 0.01 perm and 0.02 U.S. perm. In an embodiment, the backsheet 32 includes a water vapor transmission rate in a range between 0.02 perm and 0.05 U.S. perm. In an embodiment, the backsheet 32 includes a water vapor transmission rate in a range between 0.02 perm and 0.04 U.S. perm. In an embodiment, the backsheet 32 includes a water vapor transmission rate in a range between 0.02 perm and 0.03 U.S. perm. In an embodiment, the backsheet 32 includes a water vapor transmission rate in a range between 0.03 perm and 0.05 U.S. perm. In an embodiment, the backsheet 32 includes a water vapor transmission rate in a range between 0.03 perm and 0.04 U.S. perm. In an embodiment, the backsheet 32 includes a water vapor transmission rate in a range between 0.04 perm and 0.05 U.S. perm.

In an embodiment, the backsheet 32 includes a water vapor transmission rate of 0.05 U.S. perm. In an embodiment, the backsheet 32 includes a water vapor transmission rate of 0.04 U.S. perm. In an embodiment, the backsheet 32 includes a water vapor transmission rate of 0.03 U.S. perm. In an embodiment, the backsheet 32 includes a water vapor transmission rate of 0.02 U.S. perm. In an embodiment, the backsheet 32 includes a water vapor transmission rate of 0.01 U.S. perm.

Figure 3:
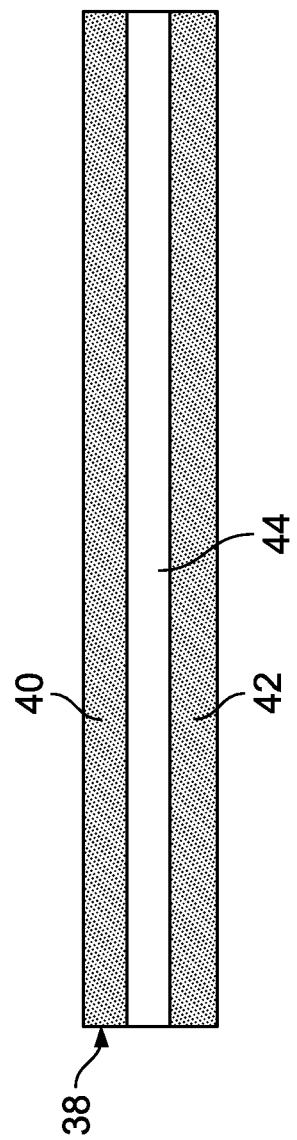
FIG. 3 is an embodiment of a photovoltaic module backsheet.

Referring to FIG. 3, in an embodiment, the membrane 38 includes a first ply 40 and a second ply 42. In an embodiment, the membrane 38 includes a scrim 44 intermediate the first ply 40 and the second ply 42. In an embodiment, the scrim 44 may be made from polyesters, polyethylene, carbon fiber, fiberglass, aramids, and combinations thereof.

In an embodiment, the backsheet 32 includes a thickness of 10 mil to 100 mil. In an embodiment, the backsheet 32 includes a thickness of 10 mil to 90 mil. In an embodiment, the backsheet 32 includes a thickness of 10 mil to 80 mil. In an embodiment, the backsheet 32 includes a thickness of 10 mil to 70 mil. In an embodiment, the backsheet 32 includes a thickness of 10 mil to 60 mil. In an embodiment, the backsheet 32 includes a thickness of 10 mil to 50 mil. In an embodiment, the backsheet 32 includes a thickness of 10 mil to 40 mil. In an embodiment, the backsheet 32 includes a thickness of 10 mil to 30 mil. In an embodiment, the backsheet 32 includes a thickness of 10 mil to 20 mil.

In an embodiment, the backsheet 32 includes a thickness of 20 mil to 100 mil. In an embodiment, the backsheet 32 includes a thickness of 20 mil to 90 mil. In an embodiment, the backsheet 32 includes a thickness of 20 mil to 80 mil. In an embodiment, the backsheet 32 includes a thickness of 20 mil to 70 mil. In an embodiment, the backsheet 32 includes a thickness of 20 mil to 60 mil. In an embodiment, the backsheet 32 includes a thickness of 20 mil to 50 mil. In an embodiment, the backsheet 32 includes a thickness of 20 mil to 40 mil. In an embodiment, the backsheet 32 includes a thickness of 20 mil to 30 mil.

In an embodiment, the backsheet 32 includes a thickness of 30 mil to 100 mil. In an embodiment, the backsheet 32 includes a thickness of 30 mil to 90 mil. In an embodiment, the backsheet 32 includes a thickness of 30 mil to 80 mil. In an embodiment, the backsheet 32 includes a thickness of 30 mil to 70 mil. In an embodiment, the backsheet 32 includes a thickness of 30 mil to 60 mil. In an embodiment, the backsheet 32 includes a thickness of 30 mil to 50 mil. In an embodiment, the backsheet 32 includes a thickness of 30 mil to 40 mil.

In an embodiment, the backsheet 32 includes a thickness of 40 mil to 100 mil. In an embodiment, the backsheet 32 includes a thickness of 40 mil to 90 mil. In an embodiment, the backsheet 32 includes a thickness of 40 mil to 80 mil. In an embodiment, the backsheet 32 includes a thickness of 40 mil to 70 mil. In an embodiment, the backsheet 32 includes a thickness of 40 mil to 60 mil. In an embodiment, the backsheet 32 includes a thickness of 40 mil to 50 mil.

In an embodiment, the backsheet 32 includes a thickness of 50 mil to 100 mil. In an embodiment, the backsheet 32 includes a thickness of 50 mil to 90 mil. In an embodiment, the backsheet 32 includes a thickness of 50 mil to 80 mil. In an embodiment, the backsheet 32 includes a thickness of 50 mil to 70 mil. In an embodiment, the backsheet 32 includes a thickness of 50 mil to 60 mil.

In an embodiment, the backsheet 32 includes a thickness of 60 mil to 100 mil. In an embodiment, the backsheet 32 includes a thickness of 60 mil to 90 mil. In an embodiment, the backsheet 32 includes a thickness of 60 mil to 80 mil. In an embodiment, the backsheet 32 includes a thickness of 60 mil to 70 mil.

In an embodiment, the backsheet 32 includes a thickness of 70 mil to 100 mil. In an embodiment, the backsheet 32 includes a thickness of 70 mil to 90 mil. In an embodiment, the backsheet 32 includes a thickness of 70 mil to 80 mil.

In an embodiment, the backsheet 32 includes a thickness of 80 mil to 100 mil. In an embodiment, the backsheet 32 includes a thickness of 80 mil to 90 mil. In an embodiment, the backsheet 32 includes a thickness of 90 mil to 100 mil.

In an embodiment, the backsheet 32 includes a thickness of 10 mil. In an embodiment, the backsheet 32 includes a thickness of 20 mil. In an embodiment, the backsheet 32 includes a thickness of 30 mil. In an embodiment, the backsheet 32 includes a thickness of 40 mil. In an embodiment, the backsheet 32 includes a thickness of 50 mil. In an embodiment, the backsheet 32 includes a thickness of 60 mil. In an embodiment, the backsheet 32 includes a thickness of 10 mil. In an embodiment, the backsheet 32 includes a thickness of 70 mil. In an embodiment, the backsheet 32 includes a thickness of 80 mil. In an embodiment, the backsheet 32 includes a thickness of 90 mil. In an embodiment, the backsheet 32 includes a thickness of 100 mil.

In an embodiment, the encapsulant 14 encapsulates 50% to 99.9% of an exterior surface area of the at least one solar cell 12, and the backsheet 32 covers 0.1% to 50% of the exterior surface area of the at least one solar cell 12. In another embodiment, the encapsulant 14 encapsulates 55% to 99.9% of an exterior surface area of the at least one solar cell 12, and the backsheet 32 covers 0.1% to 45% of the exterior surface area of the at least one solar cell 12. In another embodiment, the encapsulant 14 encapsulates 60% to 99.9% of an exterior surface area of the at least one solar cell 12, and the backsheet 32 covers 0.1% to 40% of the exterior surface area of the at least one solar cell 12. In another embodiment, the encapsulant 14 encapsulates 65% to 99.9% of an exterior surface area of the at least one solar cell 12, and the backsheet 32 covers 0.1% to 35% of the exterior surface area of the at least one solar cell 12. In another embodiment, the encapsulant 14 encapsulates 70% to 99.9% of an exterior surface area of the at least one solar cell 12, and the backsheet 32 covers 0.1% to 30% of the exterior surface area of the at least one solar cell 12. In another embodiment, the encapsulant 14 encapsulates 75% to 99.9% of an exterior surface area of the at least one solar cell 12, and the backsheet 32 covers 0.1% to 25% of the exterior surface area of the at least one solar cell 12. In another embodiment, the encapsulant 14 encapsulates 80% to 99.9% of an exterior surface area of the at least one solar cell 12, and the backsheet 32 covers 0.1% to 20% of the exterior surface area of the at least one solar cell 12. In another embodiment, the encapsulant 14 encapsulates 85% to 99.9% of an exterior surface area of the at least one solar cell 12, and the backsheet 32 covers 0.1% to 15% of the exterior surface area of the at least one solar cell 12. In another embodiment, the encapsulant 14 encapsulates 90% to 99.9% of an exterior surface area of the at least one solar cell 12, and the backsheet 32 covers 0.1% to 10% of the exterior surface area of the at least one solar cell 12. In another embodiment, the encapsulant 14 encapsulates 95% to 99.9% of an exterior surface area of the at least one solar cell 12, and the backsheet 32 covers 0.1% to 5% of the exterior surface area of the at least one solar cell 12.

In an embodiment, the encapsulant 14 encapsulates 50% to 95% of an exterior surface area of the at least one solar cell 12, and the backsheet 32 covers 5% to 50% of the exterior surface area of the at least one solar cell 12. In another embodiment, the encapsulant 14 encapsulates 55% to 95% of an exterior surface area of the at least one solar cell 12, and the backsheet 32 covers 5% to 45% of the exterior surface area of the at least one solar cell 12. In another embodiment, the encapsulant 14 encapsulates 60% to 95% of an exterior surface area of the at least one solar cell 12, and the backsheet 32 covers 5% to 40% of the exterior surface area of the at least one solar cell 12. In another embodiment, the encapsulant 14 encapsulates 65% to 95% of an exterior surface area of the at least one solar cell 12, and the backsheet 32 covers 5% to 35% of the exterior surface area of the at least one solar cell 12. In another embodiment, the encapsulant 14 encapsulates 70% to 95% of an exterior surface area of the at least one solar cell 12, and the backsheet 32 covers 5% to 30% of the exterior surface area of the at least one solar cell 12. In another embodiment, the encapsulant 14 encapsulates 75% to 95% of an exterior surface area of the at least one solar cell 12, and the backsheet 32 covers 5% to 25% of the exterior surface area of the at least one solar cell 12. In another embodiment, the encapsulant 14 encapsulates 80% to 95% of an exterior surface area of the at least one solar cell 12, and the backsheet 32 covers 5% to 20% of the exterior surface area of the at least one solar cell 12. In another embodiment, the encapsulant 14 encapsulates 85% to 95% of an exterior surface area of the at least one solar cell 12, and the backsheet 32 covers 5% to 15% of the exterior surface area of the at least one solar cell 12. In another embodiment, the encapsulant 14 encapsulates 90% to 95% of an exterior surface area of the at least one solar cell 12, and the backsheet 32 covers 5% to 10% of the exterior surface area of the at least one solar cell 12.

In another embodiment, the encapsulant 14 encapsulates 50% to 90% of an exterior surface area of the at least one solar cell 12, and the backsheet 32 covers 10% to 50% of the exterior surface area of the at least one solar cell 12. In another embodiment, the encapsulant 14 encapsulates 55% to 90% of an exterior surface area of the at least one solar cell 12, and the backsheet 32 covers 10% to 45% of the exterior surface area of the at least one solar cell 12. In another embodiment, the encapsulant 14 encapsulates 60% to 90% of an exterior surface area of the at least one solar cell 12, and the backsheet 32 covers 10% to 40% of the exterior surface area of the at least one solar cell 12. In another embodiment, the encapsulant 14 encapsulates 65% to 90% of an exterior surface area of the at least one solar cell 12, and the backsheet 32 covers 10% to 35% of the exterior surface area of the at least one solar cell 12. In another embodiment, the encapsulant 14 encapsulates 70% to 90% of an exterior surface area of the at least one solar cell 12, and the backsheet 32 covers 10% to 30% of the exterior surface area of the at least one solar cell 12. In another embodiment, the encapsulant 14 encapsulates 75% to 90% of an exterior surface area of the at least one solar cell 12, and the backsheet 32 covers 10% to 25% of the exterior surface area of the at least one solar cell 12. In another embodiment, the encapsulant 14 encapsulates 80% to 90% of an exterior surface area of the at least one solar cell 12, and the backsheet 32 covers 10% to 20% of the exterior surface area of the at least one solar cell 12. In another embodiment, the encapsulant 14 encapsulates 85% to 90% of an exterior surface area of the at least one solar cell 12, and the backsheet 32 covers 10% to 15% of the exterior surface area of the at least one solar cell 12.

In another embodiment, the encapsulant 14 encapsulates 50% to 85% of an exterior surface area of the at least one solar cell 12, and the backsheet 32 covers 15% to 50% of the exterior surface area of the at least one solar cell 12. In another embodiment, the encapsulant 14 encapsulates 55% to 85% of an exterior surface area of the at least one solar cell 12, and the backsheet 32 covers 15% to 45% of the exterior surface area of the at least one solar cell 12. In another embodiment, the encapsulant 14 encapsulates 60% to 85% of an exterior surface area of the at least one solar cell 12, and the backsheet 32 covers 15% to 40% of the exterior surface area of the at least one solar cell 12. In another embodiment, the encapsulant 14 encapsulates 65% to 85% of an exterior surface area of the at least one solar cell 12, and the backsheet 32 covers 15% to 35% of the exterior surface area of the at least one solar cell 12. In another embodiment, the encapsulant 14 encapsulates 70% to 85% of an exterior surface area of the at least one solar cell 12, and the backsheet 32 covers 15% to 30% of the exterior surface area of the at least one solar cell 12. In another embodiment, the encapsulant 14 encapsulates 75% to 85% of an exterior surface area of the at least one solar cell 12, and the backsheet 32 covers 15% to 25% of the exterior surface area of the at least one solar cell 12. In another embodiment, the encapsulant 14 encapsulates 80% to 85% of an exterior surface area of the at least one solar cell 12, and the backsheet 32 covers 15% to 20% of the exterior surface area of the at least one solar cell 12.

In another embodiment, the encapsulant 14 encapsulates 50% to 80% of an exterior surface area of the at least one solar cell 12, and the backsheet 32 covers 20% to 50% of the exterior surface area of the at least one solar cell 12. In another embodiment, the encapsulant 14 encapsulates 55% to 80% of an exterior surface area of the at least one solar cell 12, and the backsheet 32 covers 20% to 45% of the exterior surface area of the at least one solar cell 12. In another embodiment, the encapsulant 14 encapsulates 60% to 80% of an exterior surface area of the at least one solar cell 12, and the backsheet 32 covers 20% to 40% of the exterior surface area of the at least one solar cell 12. In another embodiment, the encapsulant 14 encapsulates 65% to 80% of an exterior surface area of the at least one solar cell 12, and the backsheet 32 covers 20% to 35% of the exterior surface area of the at least one solar cell 12. In another embodiment, the encapsulant 14 encapsulates 70% to 80% of an exterior surface area of the at least one solar cell 12, and the backsheet 32 covers 20% to 30% of the exterior surface area of the at least one solar cell 12. In another embodiment, the encapsulant 14 encapsulates 75% to 80% of an exterior surface area of the at least one solar cell 12, and the backsheet 32 covers 20% to 25% of the exterior surface area of the at least one solar cell 12.

In another embodiment, the encapsulant 14 encapsulates 50% to 75% of an exterior surface area of the at least one solar cell 12, and the backsheet 32 covers 25% to 50% of the exterior surface area of the at least one solar cell 12. In another embodiment, the encapsulant 14 encapsulates 55% to 75% of an exterior surface area of the at least one solar cell 12, and the backsheet 32 covers 25% to 45% of the exterior surface area of the at least one solar cell 12. In another embodiment, the encapsulant 14 encapsulates 60% to 75% of an exterior surface area of the at least one solar cell 12, and the backsheet 32 covers 25% to 40% of the exterior surface area of the at least one solar cell 12. In another embodiment, the encapsulant 14 encapsulates 65% to 75% of an exterior surface area of the at least one solar cell 12, and the backsheet 32 covers 25% to 35% of the exterior surface area of the at least one solar cell 12. In another embodiment, the encapsulant 14 encapsulates 70% to 75% of an exterior surface area of the at least one solar cell 12, and the backsheet 32 covers 25% to 30% of the exterior surface area of the at least one solar cell 12.

In another embodiment, the encapsulant 14 encapsulates 50% to 70% of an exterior surface area of the at least one solar cell 12, and the backsheet 32 covers 30% to 50% of the exterior surface area of the at least one solar cell 12. In another embodiment, the encapsulant 14 encapsulates 55% to 70% of an exterior surface area of the at least one solar cell 12, and the backsheet 32 covers 30% to 45% of the exterior surface area of the at least one solar cell 12. In another embodiment, the encapsulant 14 encapsulates 60% to 70% of an exterior surface area of the at least one solar cell 12, and the backsheet 32 covers 30% to 40% of the exterior surface area of the at least one solar cell 12. In another embodiment, the encapsulant 14 encapsulates 65% to 70% of an exterior surface area of the at least one solar cell 12, and the backsheet 32 covers 30% to 35% of the exterior surface area of the at least one solar cell 12.

In another embodiment, the encapsulant 14 encapsulates 50% to 65% of an exterior surface area of the at least one solar cell 12, and the backsheet 32 covers 35% to 50% of the exterior surface area of the at least one solar cell 12. In another embodiment, the encapsulant 14 encapsulates 55% to 65% of an exterior surface area of the at least one solar cell 12, and the backsheet 32 covers 35% to 45% of the exterior surface area of the at least one solar cell 12. In another embodiment, the encapsulant 14 encapsulates 60% to 65% of an exterior surface area of the at least one solar cell 12, and the backsheet 32 covers 35% to 40% of the exterior surface area of the at least one solar cell 12. In another embodiment, the encapsulant 14 encapsulates 50% to 60% of an exterior surface area of the at least one solar cell 12, and the backsheet 32 covers 40% to 50% of the exterior surface area of the at least one solar cell 12. In another embodiment, the encapsulant 14 encapsulates 55% to 60% of an exterior surface area of the at least one solar cell 12, and the backsheet 32 covers 40% to 45% of the exterior surface area of the at least one solar cell 12. In another embodiment, the encapsulant 14 encapsulates 50% to 55% of an exterior surface area of the at least one solar cell 12, and the backsheet 32 covers 45% to 50% of the exterior surface area of the at least one solar cell 12.

In an embodiment, the encapsulant 14 encapsulates 50% of an exterior surface area of the at least one solar cell 12 and the backsheet 32 covers 50% of the exterior surface area of the at least one solar cell 12. In another embodiment, the encapsulant 14 encapsulates 55% of the exterior surface area of the at least one solar cell 12 and the backsheet 32 covers 45% of the exterior surface area of the at least one solar cell 12. In another embodiment, the encapsulant 14 encapsulates 60% of the exterior surface area of the at least one solar cell 12 and the backsheet 32 covers 40% of the exterior surface area of the at least one solar cell 12. In another embodiment, the encapsulant 14 encapsulates 65% of the exterior surface area of the at least one solar cell 12 and the backsheet 32 covers 35% of the exterior surface area of the at least one solar cell 12. In another embodiment, the encapsulant 14 encapsulates 70% of the exterior surface area of the at least one solar cell 12 and the backsheet 32 covers 30% of the exterior surface area of the at least one solar cell 12. In another embodiment, the encapsulant 14 encapsulates 75% of the exterior surface area of the at least one solar cell 12 and the backsheet 32 covers 25% of the exterior surface area of the at least one solar cell 12. In another embodiment, the encapsulant 14 encapsulates 80% of the exterior surface area of the at least one solar cell 12 and the backsheet 32 covers 20% of the exterior surface area of the at least one solar cell 12. In another embodiment, the encapsulant 14 encapsulates 85% of the exterior surface area of the at least one solar cell 12 and the backsheet 32 covers 15% of the exterior surface area of the at least one solar cell 12. In another embodiment, the encapsulant 14 encapsulates 90% of the exterior surface area of the at least one solar cell 12 and the backsheet 32 covers 10% of the exterior surface area of the at least one solar cell 12. In another embodiment, the encapsulant 14 encapsulates 95% of the exterior surface area of the at least one solar cell 12 and the backsheet 32 covers 5% of the exterior surface area of the at least one solar cell 12. In another embodiment, the encapsulant 14 encapsulates 100% of the exterior surface area of the at least one solar cell 12.

In another embodiment, the encapsulant 14 and the backsheet 32 form a single, hybrid layer (the "encapsulant-backsheet hybrid layer"). In an embodiment, the encapsulant-backsheet hybrid layer encapsulates 50% to 99.9% of an exterior surface area of the at least one solar cell 12. In another embodiment, the encapsulant-backsheet hybrid layer encapsulates 55% to 99.9% of an exterior surface area of the at least one solar cell 12. In another embodiment, the encapsulant-backsheet hybrid layer encapsulates 60% to 99.9% of an exterior surface area of the at least one solar cell 12. In another embodiment, the encapsulant-backsheet hybrid layer encapsulates 65% to 99.9% of an exterior surface area of the at least one solar cell 12. In another embodiment, the encapsulant-backsheet hybrid layer encapsulates 70% to 99.9% of an exterior surface area of the at least one solar cell 12. In another embodiment, the encapsulant-backsheet hybrid layer encapsulates 75% to 99.9% of an exterior surface area of the at least one solar cell 12. In another embodiment, the encapsulant-backsheet hybrid layer encapsulates 80% to 99.9% of an exterior surface area of the at least one solar cell 12. In another embodiment, the encapsulant-backsheet hybrid layer encapsulates 85% to 99.9% of an exterior surface area of the at least one solar cell 12. In another embodiment, the encapsulant-backsheet hybrid layer encapsulates 90% to 99.9% of an exterior surface area of the at least one solar cell 12. In another embodiment, the encapsulant-backsheet hybrid layer encapsulates 95% to 99.9% of an exterior surface area of the at least one solar cell 12.

In another embodiment, the encapsulant-backsheet hybrid layer encapsulates 50% to 95% of an exterior surface area of the at least one solar cell 12. In another embodiment, the encapsulant-backsheet hybrid layer encapsulates 55% to 95% of an exterior surface area of the at least one solar cell 12. In another embodiment, the encapsulant-backsheet hybrid layer encapsulates 60% to 95% of an exterior surface area of the at least one solar cell 12. In another embodiment, the encapsulant-backsheet hybrid layer encapsulates 65% to 95% of an exterior surface area of the at least one solar cell 12. In another embodiment, the encapsulant-backsheet hybrid layer encapsulates 70% to 95% of an exterior surface area of the at least one solar cell 12. In another embodiment, the encapsulant-backsheet hybrid layer encapsulates 75% to 95% of an exterior surface area of the at least one solar cell 12. In another embodiment, the encapsulant-backsheet hybrid layer encapsulates 80% to 95% of an exterior surface area of the at least one solar cell 12. In another embodiment, the encapsulant-backsheet hybrid layer encapsulates 85% to 95% of an exterior surface area of the at least one solar cell 12. In another embodiment, the encapsulant-backsheet hybrid layer encapsulates 90% to 95% of an exterior surface area of the at least one solar cell 12.

In another embodiment, the encapsulant-backsheet hybrid layer encapsulates 50% to 90% of an exterior surface area of the at least one solar cell 12. In another embodiment, the encapsulant-backsheet hybrid layer encapsulates 55% to 90% of an exterior surface area of the at least one solar cell 12. In another embodiment, the encapsulant-backsheet hybrid layer encapsulates 60% to 90% of an exterior surface area of the at least one solar cell 12. In another embodiment, the encapsulant-backsheet hybrid layer encapsulates 65% to 90% of an exterior surface area of the at least one solar cell 12. In another embodiment, the encapsulant-backsheet hybrid layer encapsulates 70% to 90% of an exterior surface area of the at least one solar cell 12. In another embodiment, the encapsulant-backsheet hybrid layer encapsulates 75% to 90% of an exterior surface area of the at least one solar cell

12. In another embodiment, the encapsulant-backsheet hybrid layer encapsulates 80% to 90% of an exterior surface area of the at least one solar cell 12. In another embodiment, the encapsulant-backsheet hybrid layer encapsulates 85% to 90% of an exterior surface area of the at least one solar cell 12.

In another embodiment, the encapsulant-backsheet hybrid layer encapsulates 50% to 85% of an exterior surface area of the at least one solar cell 12. In another embodiment, the encapsulant-backsheet hybrid layer encapsulates 55% to 85% of an exterior surface area of the at least one solar cell 12. In another embodiment, the encapsulant-backsheet hybrid layer encapsulates 60% to 85% of an exterior surface area of the at least one solar cell 12. In another embodiment, the encapsulant-backsheet hybrid layer encapsulates 65% to 85% of an exterior surface area of the at least one solar cell 12. In another embodiment, the encapsulant-backsheet hybrid layer encapsulates 70% to 85% of an exterior surface area of the at least one solar cell 12. In another embodiment, the encapsulant-backsheet hybrid layer encapsulates 75% to 85% of an exterior surface area of the at least one solar cell 12. In another embodiment, the encapsulant-backsheet hybrid layer encapsulates 80% to 85% of an exterior surface area of the at least one solar cell 12.

In another embodiment, the encapsulant-backsheet hybrid layer encapsulates 50% to 80% of an exterior surface area of the at least one solar cell 12. In another embodiment, the encapsulant-backsheet hybrid layer encapsulates 55% to 80% of an exterior surface area of the at least one solar cell 12. In another embodiment, the encapsulant-backsheet hybrid layer encapsulates 60% to 80% of an exterior surface area of the at least one solar cell 12. In another embodiment, the encapsulant-backsheet hybrid layer encapsulates 65% to 80% of an exterior surface area of the at least one solar cell 12. In another embodiment, the encapsulant-backsheet hybrid layer encapsulates 70% to 80% of an exterior surface area of the at least one solar cell 12. In another embodiment, the encapsulant-backsheet hybrid layer encapsulates 75% to 80% of an exterior surface area of the at least one solar cell 12.

In another embodiment, the encapsulant-backsheet hybrid layer encapsulates 50% to 75% of an exterior surface area of the at least one solar cell 12. In another embodiment, the encapsulant-backsheet hybrid layer encapsulates 55% to 75% of an exterior surface area of the at least one solar cell 12. In another embodiment, the encapsulant-backsheet hybrid layer encapsulates 60% to 75% of an exterior surface area of the at least one solar cell 12. In another embodiment, the encapsulant-backsheet hybrid layer encapsulates 65% to 75% of an exterior surface area of the at least one solar cell 12. In another embodiment, the encapsulant-backsheet hybrid layer encapsulates 70% to 75% of an exterior surface area of the at least one solar cell 12.

In another embodiment, the encapsulant-backsheet hybrid layer encapsulates 50% to 70% of an exterior surface area of the at least one solar cell 12. In another embodiment, the encapsulant-backsheet hybrid layer encapsulates 55% to 70% of an exterior surface area of the at least one solar cell 12. In another embodiment, the encapsulant-backsheet hybrid layer encapsulates 60% to 70% of an exterior surface area of the at least one solar cell 12. In another embodiment, the encapsulant-backsheet hybrid layer encapsulates 65% to 70% of an exterior surface area of the at least one solar cell 12.

In another embodiment, the encapsulant-backsheet hybrid layer encapsulates 50% to 65% of an exterior surface area of the at least one solar cell 12. In another embodiment, the encapsulant-backsheet hybrid layer encapsulates 55% to 65% of an exterior surface area of the at least one solar cell 12. In another embodiment, the encapsulant-backsheet hybrid layer encapsulates 60% to 65% of an exterior surface area of the at least one solar cell 12. In another embodiment, the encapsulant-backsheet hybrid layer encapsulates 50% to 60% of an exterior surface area of the at least one solar cell 12. In another embodiment, the encapsulant-backsheet hybrid layer encapsulates 55% to 60% of an exterior surface area of the at least one solar cell 12. In another embodiment, the encapsulant-backsheet hybrid layer encapsulates 50% to 55% of an exterior surface area of the at least one solar cell 12.

In an embodiment, the encapsulant-backsheet hybrid layer encapsulates 50% of an exterior surface area of the at least one solar cell 12. In another embodiment, the encapsulant-backsheet hybrid layer encapsulates 55% of the exterior surface area of the at least one solar cell 12. In another embodiment, the encapsulant-backsheet hybrid layer encapsulates 60% of the exterior surface area of the at least one solar cell 12. In another embodiment, the encapsulant-backsheet hybrid layer encapsulates 65% of the exterior surface area of the at least one solar cell 12. In another embodiment, the encapsulant-backsheet hybrid layer encapsulates 70% of the exterior surface area of the at least one solar cell 12. In another embodiment, the encapsulant-backsheet hybrid layer encapsulates 75% of the exterior surface area of the at least one solar cell 12. In another embodiment, the encapsulant-backsheet hybrid layer encapsulates 80% of the exterior surface area of the at least one solar cell 12. In another embodiment, the encapsulant-backsheet hybrid layer encapsulates 85% of the exterior surface area of the at least one solar cell 12. In another embodiment, the encapsulant-backsheet hybrid layer encapsulates 90% of the exterior surface area of the at least one solar cell 12. In another embodiment, the encapsulant-backsheet hybrid layer encapsulates 95% of the exterior surface area of the at least one solar cell 12. In another embodiment, the encapsulant-backsheet hybrid layer encapsulates 100% of the exterior surface area of the at least one solar cell 12.

In an embodiment, the photovoltaic module 10 includes a Class 4 rating when tested in accordance with ANSI FM 4473. In an embodiment, the frontsheet 16 includes a fire resistance that conforms to standards under UL 94 test standards. In an embodiment, the frontsheet 16 includes a V-0 rating when tested in accordance with UL 94. In another embodiment, the frontsheet 16 includes a V-1 rating when tested in accordance with UL 94. In another embodiment, the frontsheet 16 includes a V-2 rating when tested in accordance with UL 94. In an embodiment, the photovoltaic module 10 is a component of a roofing/building integrated photovoltaic system that conforms to standards under UL 790/ASTM E 108 test standards. In an embodiment, the roofing/building integrated photovoltaic system includes a Class A rating when tested in accordance with UL 790/ASTM E 108.

In an embodiment, the photovoltaic module 10 includes a solar weighted transmittance of 90% to 99.9%. In another embodiment, the photovoltaic module 10 includes a solar weighted transmittance of 91% to 99.9%. In another embodiment, the photovoltaic module 10 includes a solar weighted transmittance of 92% to 99.9%. In another embodiment, the photovoltaic module 10 includes a solar weighted transmittance of 93% to 99.9%. In another embodiment, the photovoltaic module 10 includes a solar weighted transmittance of 94% to 99.9%. In another embodiment, the photovoltaic module 10 includes a solar weighted transmittance of 95% to 99.9%. In another embodiment, the photovoltaic module 10 includes a solar weighted transmittance of 96% to 99.9%. In another embodiment, the photovoltaic module 10 includes a solar weighted transmittance of 97% to 99.9%. In another embodiment, the photovoltaic module 10 includes a solar weighted transmittance of 98% to 99.9%. In another embodiment, the photovoltaic module 10 includes a solar weighted transmittance of 99% to 99.9%. In another embodiment, the photovoltaic module 10 includes a solar weighted transmittance of 80% to 99.9%. In another embodiment, the photovoltaic module 10 includes a solar weighted transmittance of 85% to 99.9%.

In an embodiment, the photovoltaic module 10 includes a solar weighted reflectance of 0.01% to 5%. In an embodiment, the photovoltaic module 10 includes a solar weighted reflectance of 0.01% to 4%. In an embodiment, the photovoltaic module 10 includes a solar weighted reflectance of 0.01% to 3%. In an embodiment, the photovoltaic module 10 includes a solar weighted reflectance of 0.01% to 2%. In an embodiment, the photovoltaic module 10 includes a solar weighted reflectance of 0.01% to 1%. In an embodiment, the photovoltaic module 10 includes a solar weighted reflectance of 0.01% to 0.5%.

The embodiments described herein are merely exemplary and that a person skilled in the art may make many variations and modifications without departing from the spirit and scope of the invention. All such variations and modifications are intended to be included within the scope of the invention.

What is claimed is:

1. A photovoltaic module, comprising:
   at least one solar cell;
   an encapsulant encapsulating the at least one solar cell, wherein a thickness of the encapsulant is 0.5 mm to 1.8 mm; and
   a frontsheet adjacent to the encapsulant,
   wherein the frontsheet includes
   a glass layer,
     wherein a thickness of the glass layer is 2.5 mm to 4 mm,
   a polymer layer
     wherein the polymer layer includes a fluoropolymer selected from the group consisting of ethylene tetrafluoroethylene (ETFE), polyvinylidene fluoride (PVDF), tetrafluoroethylene-hexafluoropropylene copolymers (FEP), tetrafluoroethylene-hexafluoropropylene-vinylidene fluoride copolymers (THV), polyvinyl fluoride (PVF), and blends thereof, and
   wherein a thickness of the polymer layer is 0.01 mm to 0.5 mm, an adhesive layer directly adhering the glass layer to the polymer layer,
   wherein the adhesive layer is selected from the group consisting of thermosetting polyolefin, thermosetting polyolefin encapsulant material, thermosetting ethylene-vinyl acetate (EVA), EVA encapsulants, thermoplastic polyolefin (TPO) and hybrids and combinations thereof,
   wherein a thickness of the adhesive layer is 50 micrometers to 700 micrometers, and
   wherein the glass layer of the frontsheet is adjacent to the encapsulant encapsulating the at least one solar cell,
   wherein the photovoltaic module is configured to be installed on a roof deck, and
   wherein, when the photovoltaic module is installed on the roof deck, the polymer layer is a top layer opposite the roof deck.

2. The photovoltaic module of claim 1, wherein the adhesive layer includes a thermosetting polyolefin encapsulant material.

3. The photovoltaic module of claim 1, wherein the thickness of the polymer layer is 0.025 mm to 0.1 mm.

4. The photovoltaic module of claim 1, further comprising a backsheet juxtaposed with the encapsulant.

5. The photovoltaic module of claim 4, wherein the backsheet includes thermoplastic polyolefin (TPO).

6. The photovoltaic module of claim 1, wherein the polymer layer includes ethylene tetrafluoroethylene (ETFE).

7. The photovoltaic module of claim 1, wherein the polymer layer includes polyvinylidene fluoride (PVDF).

8. The photovoltaic module of claim 1, wherein the polymer layer includes tetrafluoroethylene-hexafluoropropylene copolymers (FEP).

9. The photovoltaic module of claim 1, wherein the adhesive layer is selected from the group consisting of thermosetting polyolefin encapsulant material and EVA encapsulants.

10. The photovoltaic module of claim 1, wherein the thickness of the encapsulant is 0.8 mm to 1.4 mm.

* * * * *